(12) United States Patent
Hazelton et al.

(10) Patent No.: US 6,486,941 B1
(45) Date of Patent: Nov. 26, 2002

(54) GUIDELESS STAGE

(75) Inventors: Andrew J. Hazelton, San Carlos; Bausan Yuan, San Jose, both of CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/557,122

(22) Filed: Apr. 24, 2000

(51) Int. Cl.⁷ .......................... G03B 27/42; G03B 27/58
(52) U.S. Cl. .......................................... 355/72; 355/53
(58) Field of Search ........................ 355/53.1, 72, 53; 318/568.17, 687; 74/490.09; 396/500; 33/1 M; 310/12

(56) References Cited

U.S. PATENT DOCUMENTS

| | | | |
|---|---|---|---|
| 4,655,594 A | 4/1987 | Wittekoek et al. | |
| 5,040,431 A | * 8/1991 | Sakino et al. | 74/490.09 |
| 5,528,118 A | * 6/1996 | Lee | 318/568.17 |
| 5,610,686 A | * 3/1997 | Osanai | 355/72 |
| 5,623,853 A | * 4/1997 | Novak et al. | 74/490.09 |
| 5,699,621 A | 12/1997 | Trumper et al. | |
| 5,760,564 A | * 6/1998 | Novak | 318/687 |
| 5,858,587 A | * 1/1999 | Yamane et al. | 430/22 |
| 5,864,389 A | * 1/1999 | Osanai et al. | 355/53 |
| 5,909,272 A | 6/1999 | Osanai et al. | 318/640 |
| 5,939,852 A | 8/1999 | Akutsu et al. | 355/53 |
| 6,028,376 A | * 2/2000 | Osanai et al. | 310/12 |
| 6,038,013 A | * 3/2000 | Ohaski | 355/53 |

FOREIGN PATENT DOCUMENTS

| | | |
|---|---|---|
| JP | 6-163359 | 6/1994 |
| JP | 7-325176 | 12/1995 |
| JP | 11-168064 | 6/1999 |
| WO | WO 099/16080 | 4/1999 |

OTHER PUBLICATIONS

Translation of Japanese Patent Publication No. 6–163359.

* cited by examiner

Primary Examiner—Russell Adams
Assistant Examiner—Rodney Fuller
(74) Attorney, Agent, or Firm—Steven G. Roeder; Jim Rose, Esq.

(57) ABSTRACT

A stage assembly (10) for moving and positioning a device (24) includes a stage base (12), a first stage frame (40), and a second stage frame (66). The stage assembly (10) also includes a pair of X movers (82) (84), and a first stage Y mover (86) that precisely move the first stage frame (40) relative to the stage base (12). Uniquely, the first stage frame (40) is guideless along the X axis, along the Y axis and about the Z axis. With this design, movers (82) (84) (86) can precisely control the position of the first stage frame (40) along the X axis, along the Y axis and about the Z axis. Further, current to the X movers (82) (84) is varied according to the position of the second stage frame (66) relative to the first stage frame (40). These features allow for more accurate positioning of the device (24) by the stage assembly (10) and better performance of the stage assembly (10).

79 Claims, 15 Drawing Sheets

GUIDELESS STAGE

FIELD OF THE INVENTION

The present invention is directed to a stage for moving a device. More specifically, the present invention is directed to a guideless stage for an exposure apparatus.

BACKGROUND

Exposure apparatuses are commonly used to transfer images from a reticle onto a semiconductor wafer during semiconductor processing. A typical exposure apparatus includes an illumination source, a reticle stage assembly retaining a reticle, a lens assembly and a wafer stage assembly retaining a semiconductor wafer. The reticle stage assembly and the wafer stage assembly are supported above a ground with an apparatus frame. Typically, the wafer stage assembly includes one or more motors to precisely position the wafer and the reticle stage assembly includes one or more motors to precisely position the reticle stage. The size of the images transferred onto the wafer from the reticle is extremely small. Accordingly, the precise relative positioning of the wafer and the reticle is critical to the manufacturing of high density, semiconductor wafers.

A typical wafer stage assembly includes a stage base, a first stage and a second stage. The stages move relative to the stage base to position the wafer. The first stage is used for relatively large movements of the wafer along a X axis. The second stage is used for relatively large movements of the wafer along a Y axis Existing wafer stage assemblies typically include a fixed guide with an air bearing that inhibits the first stage from moving along the Y axis and rotating about a Z axis relative to the stage base. With this design, if the stage base is rigidly connected to the reticle stage assembly, only 2 degrees of freedom, e.g. along the X axis and the Y axis, are required to maintain synchronization between the reticle stage assembly and the wafer stage assembly. U.S. Pat. No. 5,623,853, assigned to Nikon Precision Inc. illustrates an example of this type of stage assembly.

Unfortunately, if the stage base is not attached to the reticle stage assembly, rotation of the stage base will cause an alignment error between the reticle and the wafer. In this case, a strict requirement on the maximum rotation of the stage base is required to minimize the alignment error between the reticle and the wafer. Additionally, the fixed guide and air bearing combination generate a resonance that limits high bandwidth servo control of the first stage. This reduces the accuracy of positioning of the first stage and degrades the accuracy of the exposure apparatus.

In light of the above, one object of the present invention is to provide a stage assembly that can be moved with complete freedom in the planar degrees of freedom. Another object is to provide a stage assembly that can be precisely controlled in the planar degrees of freedom. Another object is to provide a stage assembly that is guideless in the planar degrees of freedom. Still another object is to provide a stage assembly having less resonances. Another object is to provide a wafer stage assembly that can correct alignment errors between the reticle and the wafer. Another object is to provide an exposure apparatus capable of manufacturing precision devices such as high density, semiconductor wafers.

SUMMARY

The present invention is directed to a stage assembly for moving a device that satisfies these needs. The stage assembly includes a stage base and a first stage frame. The first stage frame moves the device relative to the stage base along a X axis, along a Y axis that is substantially orthogonal to the X axis, and around a Z axis that is substantially orthogonal to the X axis and the Y axis relative to the stage base. Stated another way, the first stage frame is guideless along the X axis, along the Y axis and about the Z axis (sometimes collectively referred to as "the planar degrees of freedom") and is not constrained along the Y axis, the X axis and about the Z axis. With this design, a pair of X movers and a first stage Y mover can precisely control the position of the first stage frame along the X axis, along the Y axis and about the Z axis. This allows for more accurate positioning of the device and better performance of the stage assembly.

Additionally, as a result of this design, there are no fixed guides that restrict the movement of the first stage frame in the planar degrees of freedom relative to the stage base. Thus, there are no resonances caused by fixed guides that influence the position of the first stage frame.

The X movers move the first stage frame along the X axis and about the Z axis while the first stage Y mover moves the first stage frame along the Y axis. The stage assembly also includes a second stage frame and a control system. The second stage frame moves relative to the first stage frame along the Y axis. The control system controls current to the X movers and the first stage Y mover.

Uniquely, the control system varies the amount of current to each X mover according to the position of the second stage frame relative to the first stage frame. As provided herein, the first stage frame and the second stage frame having a combined center of gravity that moves as the second stage frame moves relative to the first frame.

The control system controls current to each X mover based upon the location of the combined center of gravity. With this design, the X movers do not generate unwanted torque about the Z axis and the X movers move the first stage frame and the second stage frame in a smooth manner along the X axis.

The stage assembly also includes a second stage Y mover that moves the second stage frame along the Y axis relative to the first stage frame. Preferably, the stage assembly also includes a reaction stage and a trim mover that are coupled to the second stage Y mover. The reaction stage and trim mover transfer reaction forces from the second stage Y mover away from the first stage frame. A trim mover can be connected to the reaction stage.

The present invention is also directed to a method for making a stage assembly, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
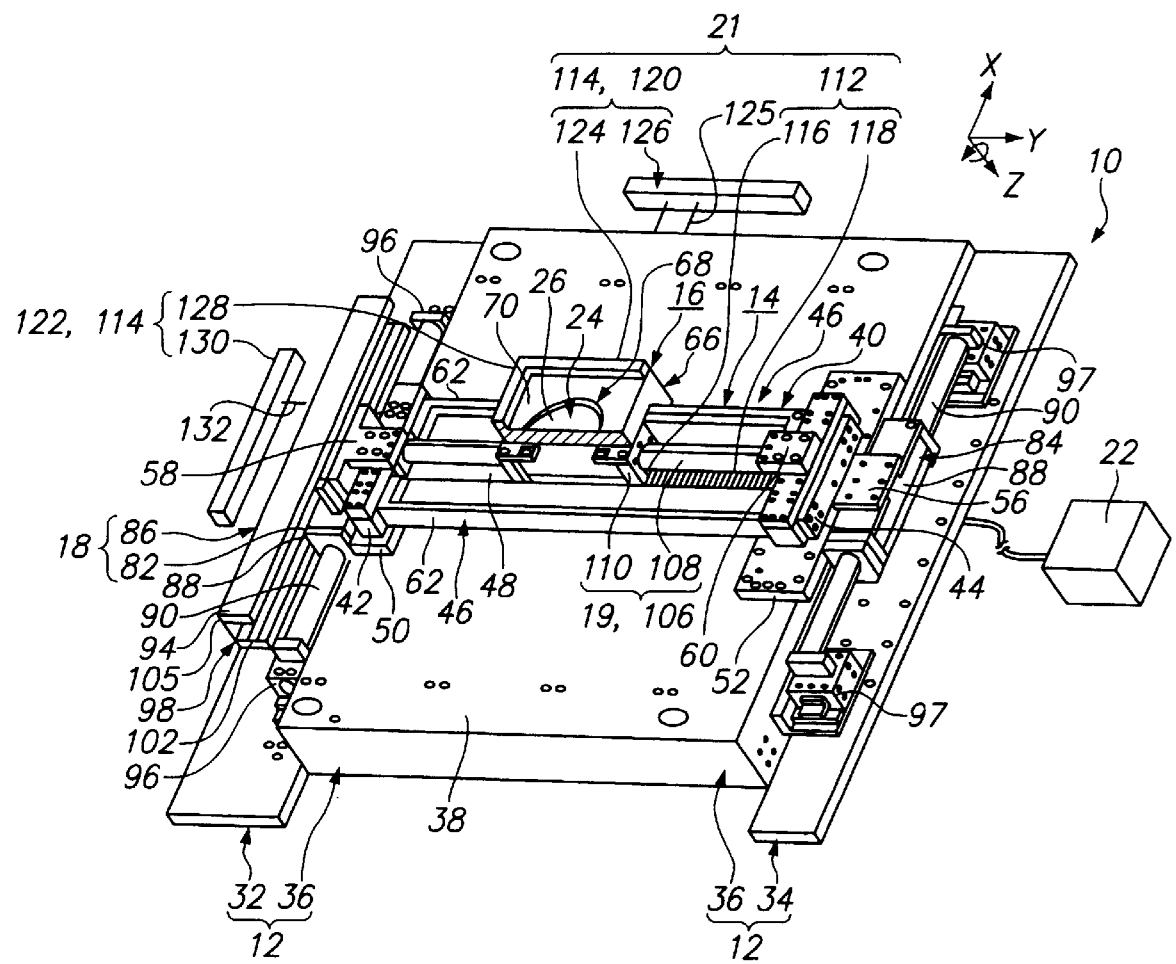
FIG. 1 is a perspective view, in partial cut-away, of a stage assembly having features of the present invention.
Figure 5:
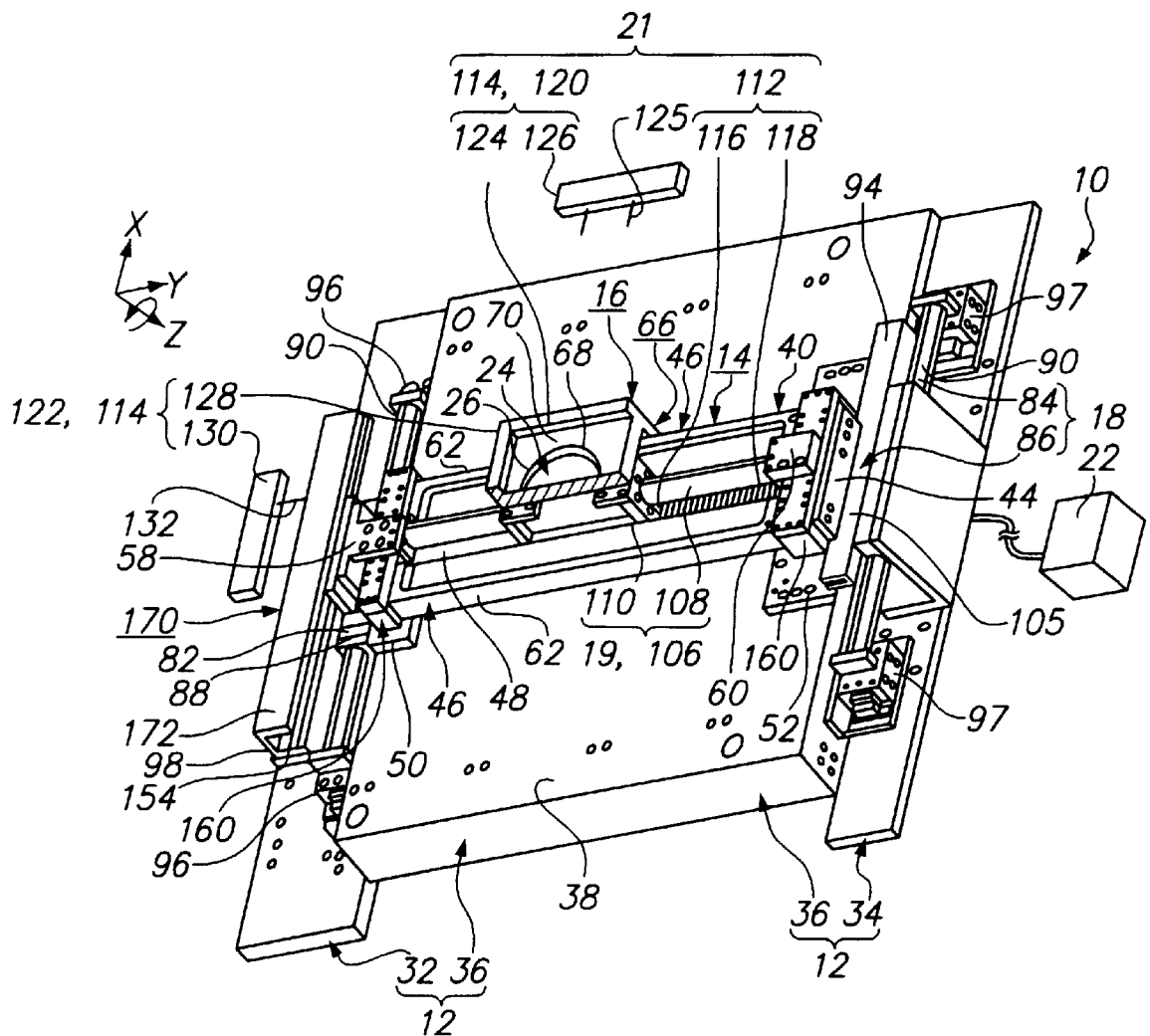
FIG. 5 is a perspective view, in partial cut-away, of a second embodiment of a stage assembly having features of the present invention.

Referring initially to FIGS. 1 and 5, a stage assembly 10 having features of the present invention includes a stage base 12, a first stage 14, a second stage 16, a first mover assembly 18, a second mover assembly 19, a mounting base 20 (illustrated in FIG. 8), a measurement system 21 and a control system 22. As an overview, the first mover assembly 18 moves the first stage 14 relative to the stage base 12 and the mounting base 20. The second mover assembly 19 moves the second stage 16 relative to the first stage 14, the stage base 12 and the mounting base 20. The measurement system 21 monitors movement of the stages 14, 16. The control system 22 controls the first mover assembly 18 and the second mover assembly 19 to precisely position the stages 14, 16 relative to the stage base 12.

The stage assembly 10 is particularly useful for precisely positioning a device 24 during a manufacturing and/or an inspection process. The type of device 24 positioned and moved by the stage assembly 10 can be varied. For example, each device 24 can be a semiconductor wafer 26 and the stage assembly 10 can be used as part of an exposure apparatus 28 (illustrated in FIG. 8) for precisely positioning the semiconductor wafer 26 during manufacturing of the semiconductor wafer 26.

Alternately, for example, the stage assembly 10 can be used to move other types of devices 26 during manufacturing, to move a device under an electron microscope (not shown), to move a device during a precision measurement operation (not shown), or to move a device during a precision manufacturing operation.

Some of the Figures provided herein include a coordinate system that designates an X axis, a Y axis and a Z axis. It should be understood that the coordinate system is merely for reference and can be varied. For example, the X axis can be switched with the Y axis and/or the stage assembly 10 can be rotated.

Figure 2:
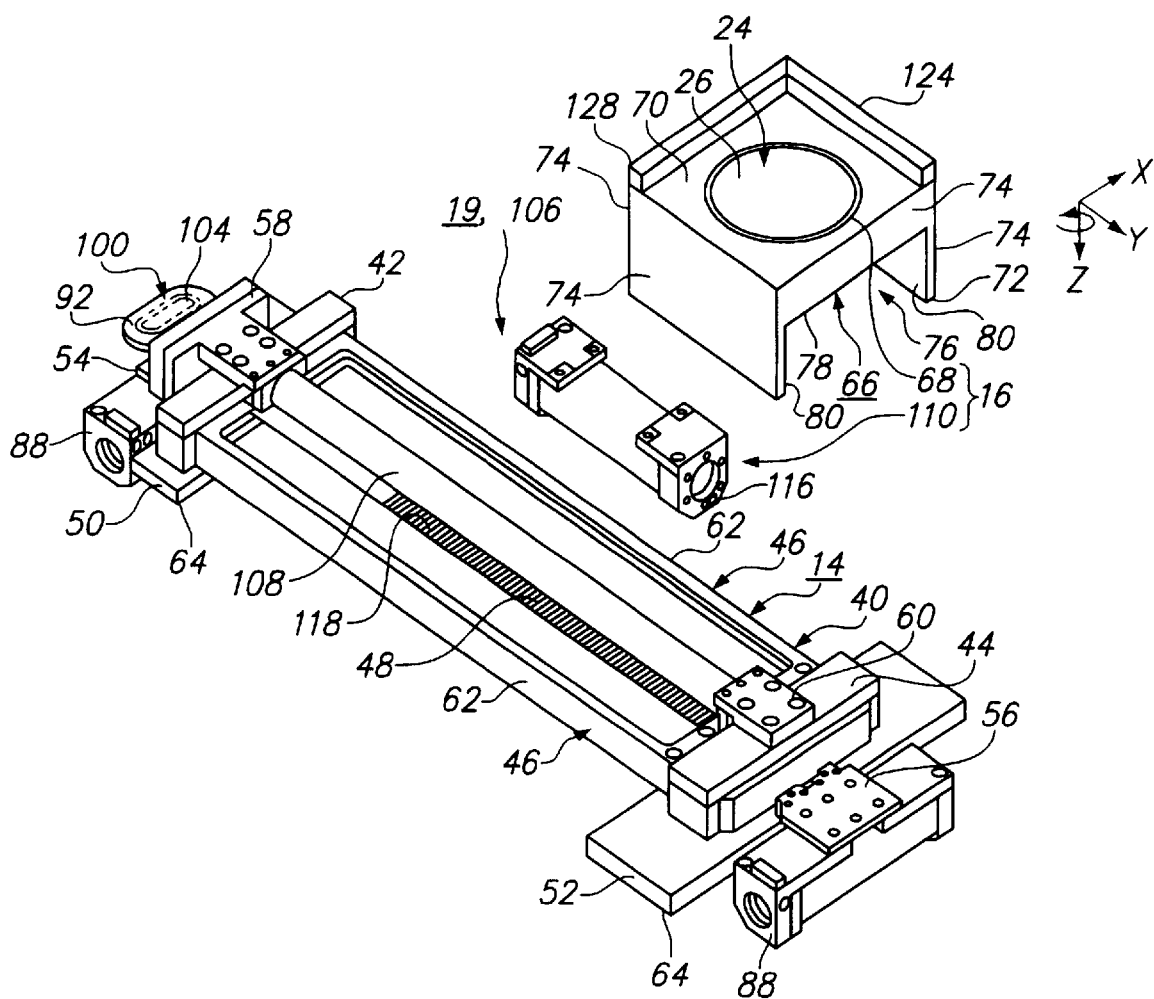
FIG. 2 is an exploded, perspective view of a portion of the stage assembly of FIG. 1.
Figure 6:
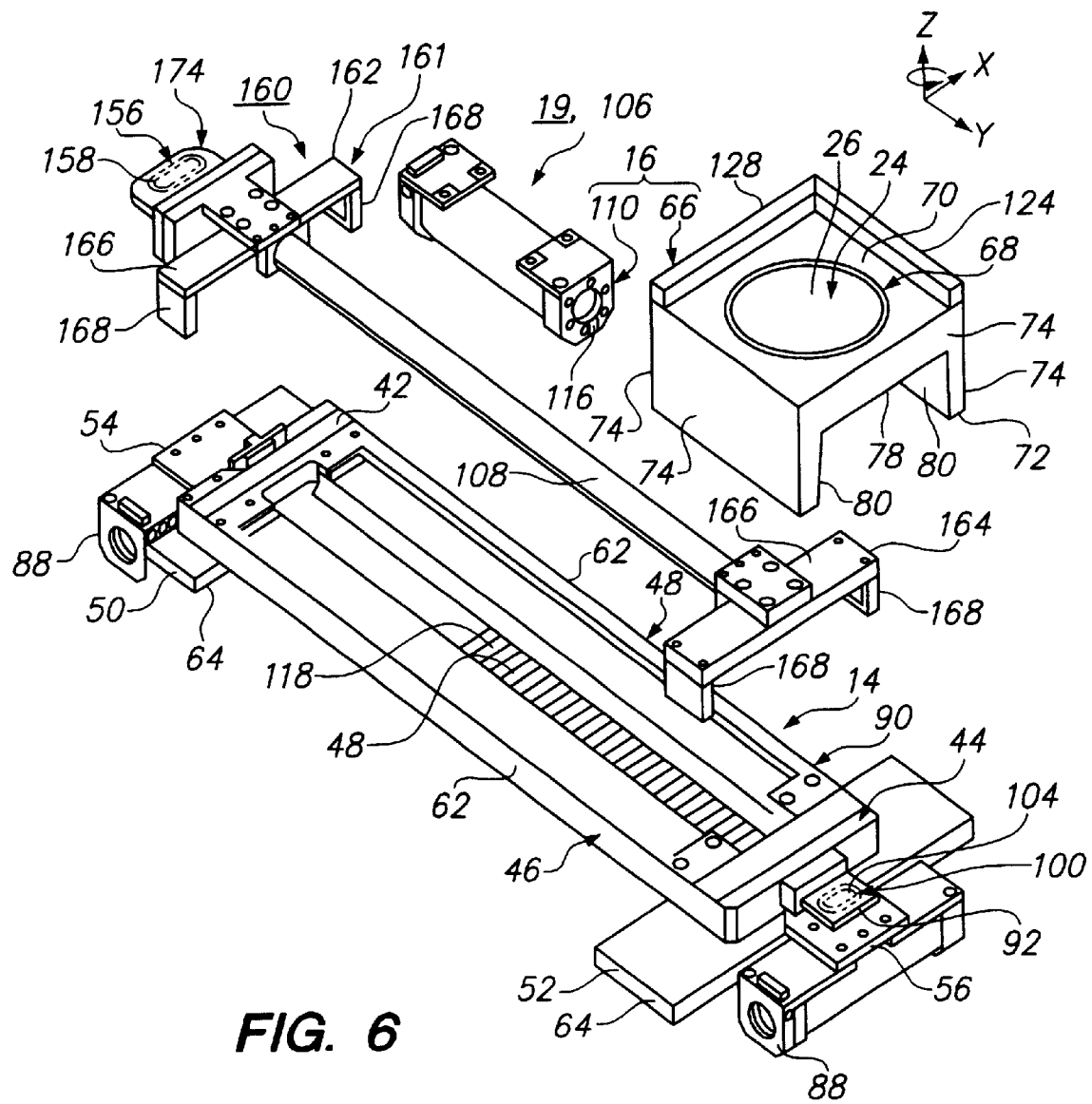
FIG. 6 is an exploded, perspective view of a portion of the stage assembly of FIG. 5.

A couple of alternate embodiments of the stage assembly 10 are illustrated in the Figures. In particular, FIG. 1 illustrates a perspective view of a first embodiment of the stage assembly 10 and FIG. 5 illustrates a perspective view of a second embodiment of the stage assembly 10. FIG. 2 illustrates an exploded perspective of a portion of the first embodiment of the stage assembly 10, and FIG. 6 illustrates an exploded perspective view of a portion of the second embodiment of the stage assembly 10.

Importantly, in each embodiment, the first stage 14 is moved relative to the stage base 12 with complete freedom along the X axis, along the Y axis and about the Z axis (collectively "the planar degrees of freedom"). More specifically, the first mover assembly 18 moves and positions the first stage 14 along the X axis, along the Y axis and about the Z axis under the control of the control system 22. This improves the positioning performance of the stage assembly 10 in the planar degrees of freedom.

As a result of this design, there are no fixed guides (not shown) that restrict the movement of the first stage 14 in the planar degrees of freedom relative to the stage base 12. Thus, there are no resonances caused by fixed guides that influence the position of the first stage 14. Additionally, by allowing for motion in all planar degrees of freedom, the present design makes it easier to disconnect the stage assembly 10 used to move the semiconductor wafer 26 from the stage assembly 206 (illustrated in FIG. 8) used to move a reticle 30 (illustrated in FIG. 8). This allows for more accurate positioning of the wafer 26 relative to the reticle 30 in the exposure apparatus 28.

The stage base 12 supports the stages 14, 16 and retains a portion of the first mover assembly 18 near the first stage 14. The design of the stage base 12 can be varied to suit the design requirements of the stage assembly 10. In the embodiment illustrated in FIGS. 1 and 5, the stage base 12 includes a first base mount 32, a second base mount 34 spaced apart from the first base mount 32, and a base plate 36. Each base mount 32, 34 is generally flat plate shaped. The base plate 36 is generally rectangular shaped and includes an upper planar surface 38. The base plate 36 can be made of granite. The base mounts 32, 34 are positioned on opposite sides of the base plate 36.

Figure 8:
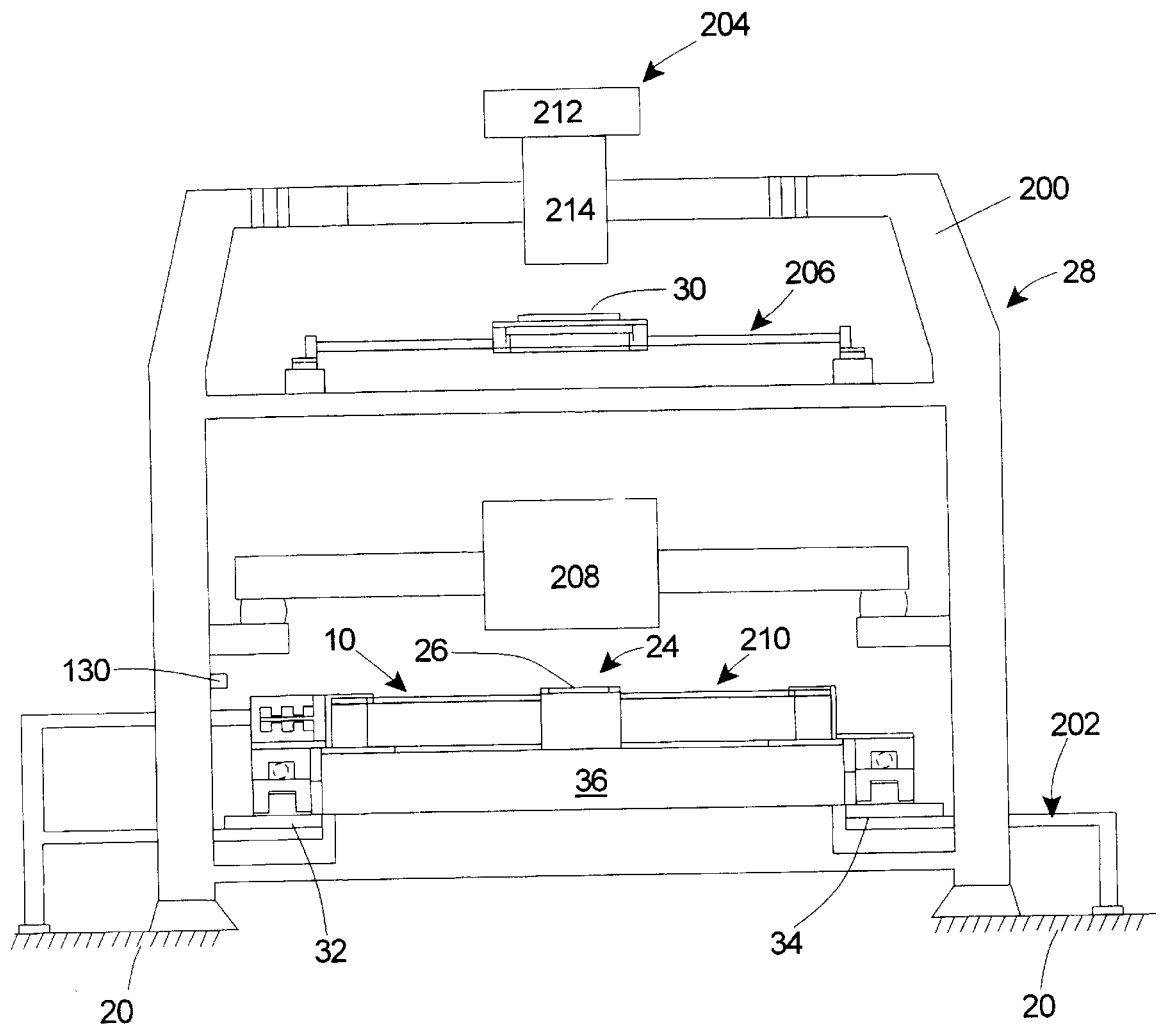
FIG. 8 is a schematic illustration of an exposure apparatus having features of the present invention.

The stage base 12 can be secured to the mounting base 20 with an apparatus frame 200 and a reaction frame 202 as illustrated in FIG. 8. In the embodiment illustrated in FIG. 8, each base mount 32, 34 is secured to the mounting base 20 with the reaction frame 202 and the base plate 36 is secured to the mounting base 20 with the apparatus frame 200. With this design, the reaction forces from the first mover assembly 18 are transferred to the mounting base 20 with reaction frame 202. This inhibits the reaction forces from the first mover assembly 18 from influencing the position of the base plate 36. Alternately, for example, the base mounts and the base plate can both be secured to the apparatus frame. Still alternately, the base plate 36 can be mounted with an isolation system (not shown) that is connected to the mounting base 20.

The first stage 14 moves relative to the stage base 12 with at least the planar degrees of freedom. The design of the first stage 14 can be varied to suit the design requirements of the stage assembly 10. In the embodiment illustrated in FIGS. 1 and 2, the first stage 14 includes a first stage frame 40, a portion of the first mover assembly 18, a portion of the second mover assembly 19, and a portion of the measurement system 21.

As can best be seen in FIG. 2, the first stage frame 40 includes (i) a generally rectangular shaped first end block 42, (ii) a generally rectangular shaped second end block 44 spaced apart from the first end block 42, (iii) a pair of spaced apart, substantially parallel guide bars 46 that extend between the end blocks 42, 44, (iv) a flat, intermediate bar 48 that extends between the end blocks 42, 44 substantially parallel with the guide bars 46, (iv) a first bearing pad 50 positioned below the first end block 42, (v) a second bearing pad 52 positioned below the second end block 44, (vi) a first plate 54 that cantilevers away from the first bearing pad 50, (vii) a second plate 56 that cantilevers away from the second bearing pad 52, (viii) a first block mount 58 secured to the first end block 42, and (ix) a second block mount 60 secured to the second end block 44. The components of the first stage frame 40 can be made of a number of materials, including ceramic, such as alumina or silicon carbide, metals such as aluminum, composite materials, or plastic.

Each guide bar 46 includes a side, planar, bar bearing surface 62 that is used to guide the second stage 16 as provided below. Each bearing pad 50, 52 includes a planar, pad bearing surface 64 that is positioned adjacent to the upper planar surface 38 of the base plate 36. In this embodiment, each of the bearing pads 50, 52 includes a plurality of spaced apart, fluid outlets (not shown) and a plurality of spaced apart, fluid inlets (not shown). Pressurized fluid (not shown) is released from the fluid outlets towards the upper planar surface 38 of the base plate 36 and a vacuum is pulled in the fluid inlets to create a vacuum preload type, fluid bearing between each bearing pad 50, 52 and the base plate 36. The vacuum preload type, fluid bearing maintains the first stage 14 spaced apart along the Z axis relative to the base plate 36 and allows for motion of the first stage 14 along the X axis, the Y axis and about the Z axis relative to the base plate 36.

Alternately, the first stage 14 can be supported spaced apart from the base plate 36 by other ways. For example, a magnetic type bearing could be utilized that allows for motion of the first stage 14 relative to the base plate 36.

The second stage 16 moves relative to the first stage 14 along the Y axis. The design of the second stage 16 can be varied to suit the design requirements of the stage assembly 10. In the embodiment illustrated in FIGS. 1 and 2, the second stage 16 includes a second stage frame 66, a device holder 68, a portion of the second mover assembly 19 and a portion of the measurement system 21.

The second stage frame 66 illustrated in FIG. 2 is generally cubed shaped and includes a top 70, a bottom 72 and four sides 74 (only two sides 74 are illustrated in FIG. 2). The second stage frame 66 also includes a generally rectangular shaped, stage channel 76 that is sized and shaped to receive a portion of the second mover assembly 19 and the guide bars 46. The stage channel 76 defines an upper surface 78 and a pair of spaced apart, planar side surfaces 80.

The device holder 68 retains the device 24 during processing. The design of the device holder 68 can be varied. In the embodiment illustrated in FIGS. 1 and 2, the device holder 68 is a vacuum chuck. The device holder 68 is positioned at the top 70 of the second stage frame 66.

In this embodiment illustrated in the Figures, the bottom 72 of the second stage frame 66 includes a plurality of spaced apart, fluid outlets (not shown) and a plurality of spaced apart, fluid inlets (not shown). Pressurized fluid (not shown) is released from the fluid outlets towards the upper planar surface 38 of the base plate 36 and a vacuum is pulled in the fluid inlets to create a vacuum preload type, fluid bearing between the second stage frame 66 and the base plate 36. The vacuum preload type, fluid bearing maintains the second stage 16 spaced apart along the Z axis relative to the base plate 36 and allows for motion of the second stage 16 along the Y axis relative to the base plate 36.

Alternately, the second stage 16 can be supported above the base plate 36 by other ways. For example, a magnetic type bearing could be utilized that allows for movement of the second stage 16 relative to the first stage 14 and the base plate 36.

Also, in the embodiment illustrated in the Figures, each of the side surfaces 80 of the second stage frame 66 includes a plurality of spaced apart, fluid outlets (not shown). Pressurized fluid (not shown) is released from the fluid outlets towards the bar bearing surface 62 of each guide bar 46 to create a fluid bearing between the second stage frame 66 and the guide bars 46. The fluid bearing maintains the second stage 16 spaced apart from the first stage 14 along the X axis and allows for motion of the second stage 16 along the Y axis relative to the first stage 14.

The first mover assembly 18 controls and moves the first stage 14 relative to the stage base 12 along the X axis, along the Y axis and about the Z axis, and the second mover assembly 19 controls and moves the second stage 16 relative to the first stage 14 along the Y axis. More specifically, in the embodiment illustrated in FIG. 1, the first mover assembly 18 moves the first stage 14 with a relatively large displacement along the X axis, a limited displacement along the Y axis, and a limited displacement about the Z axis (theta Z) relative to the base plate 36. Further, the second mover assembly 19 moves the second stage 16 with a relatively large displacement along the Y axis relative to the first stage 14. However, the design of the mover assemblies 18, 19 and the movement of the stages 14, 16 can be varied.

The design of the first mover assembly 18 and the second mover assembly 19 can be varied to suit the movement requirements of the stage assembly 10. In the embodiment illustrated in FIGS. 1 and 2, the first mover assembly 18 includes a first X mover 82, a second X mover 84, and a first stage Y mover 86. The movers 82, 84, 86 move the first stage 14 along the X axis, along the Y axis and about the Z axis. More specifically, in this embodiment, (i) the first and second X movers 82, 84 move the first stage 14 with a relatively large displacement along the X axis and with a limited range of motion about the Z axis (theta Z), and (ii) the first stage Y mover 86 moves the first stage 14 with a relatively small displacement along the Y axis.

The design of each mover 82, 84, 86 can be varied to suit the movement requirements of the stage assembly 10. As provided herein, each X mover 82, 84 includes an X stage component 88 and an adjacent X base component 90 that interacts with the X stage component 88. The first stage Y mover 86 includes a first Y stage component 92 and an adjacent first Y base component 94 that interacts with the first Y stage component 92.

The stage component 88, 92 of each mover 82, 84, 86 is secured to the first stage frame 40, moves with the first stage frame 40 and is part of the first stage 14. In contrast, the base components 90, 94 of each mover 82, 84, 86 is secured to the stage base 12.

As an overview, in each embodiment illustrated herein, the stage component 88, 92 moves relative to the corresponding base component 90, 94 of each mover 82, 84, 86. Further, a gap (not shown) exists between the stage component 88, 92 and the corresponding base component 90, 94 of each mover 82, 84, 86. Typically, the gap is between approximately one millimeter and five millimeters. However, depending upon the design of the particular mover 82, 84, 86, a larger or smaller gap may be utilized.

Additionally, in each embodiment, one of the components 88, 90, 92, 94 of each mover 82, 84, 86 includes one or more magnet arrays 98 and the other component 88, 90, 92, 94 of each mover 82, 84, 86 includes one or more conductor arrays 100.

Each magnet array 98 includes one or more magnets 102. The design of each magnet array 98 and the number of magnets 102 in each magnet array 98 can be varied to suit the design requirements of the movers 82, 84, 86. In the embodiments provided herein, each magnet 102 for the first stage Y mover 86 is substantially rectangular shaped and each magnet (not shown) for each X movers 82, 84 is cylindrical shaped. However, the shape of each magnet 102 can be varied.

Each conductor array 100 includes one or more conductors 104. The design of each conductor array 100 and the number of conductors 104 in each conductor array 100 is varied to suit the design requirements of the mover 82, 84, 86. Each conductor 104 can be made of metal such as copper or any substance or material responsive to electrical current and capable of creating a magnetic field such as superconductors. In the embodiments illustrated herein, each conductor 104 is a substantially annular shaped coil. Each coil typically includes a plurality of electrical wires encapsulated in an epoxy.

Electrical current (not shown) is individually supplied to each conductor 104 in each conductor array 100 by the control system 22. For each mover 82, 84, 86, the electrical current in each conductor 104 interacts with a magnetic field (not shown) generated by one or more of the magnets 102 in the magnet array 98. This causes a force (Lorentz force) between the conductors 104 and the magnets 102 that can be used to move the first stage 14 relative to the stage base 12.

Specifically, the X stage component 88 and the X base component 90 of each X mover 82, 84 interact to selectively move the first stage 14 along the X axis and about the Z axis relative to the stage base 12. In the embodiment illustrated in the FIG. 1, each X mover 82, 84 is a shaft type, commutated, linear motor. The X stage component 88 for each X mover 82, 84 is secured to one of the end blocks 42, 44 and the X base component 90 for each X mover 82, 84 is secured to one of the base mounts 32, 34. More specifically, for the first X mover 82, (i) the X stage component 88 is secured to the first end block 42 with the first plate 54 and (ii) the X base component 90 is secured to the first base mount 32 with a pair of spaced apart first mount blocks 96. For the second X mover 84, (i) the X stage component 88 is secured to the second end block 44 with the second plate 56 and (ii) the X base component 90 is secured to the second base mount 34 with a pair of spaced apart second mount blocks 97.

In this embodiment, the X stage component 88 of each X mover 82, 84 includes a conductor array (not shown) having a plurality of spaced apart conductors (not shown) while the X base component 90 of each X mover 82, 84 includes a magnet array (not shown) including a plurality of magnets (not shown). Alternately, for example, the configuration of the coil array and the magnet array can be reversed.

With this design, the X movers 82, 84 make relatively large displacement adjustments to the position of the stage base 12 along the X axis. The required stroke of the X movers 82, 84 along the X axis will vary according to desired use of the stage assembly 10. More specifically, for an exposure apparatus 28, generally, the stroke of the X movers 82, 84 for moving the wafer 26 is between approximately 300 millimeters and 450 millimeters.

The X movers 82, 84 also make relatively slight adjustments to position of the first stage 14 about the Z axis. In order to make the adjustments about the Z axis, the X stage component 88 of one of the X movers 82, 84 is moved relative to the X stage component 88 of the other X movers 82, 84. With this design, the X movers 82, 84 generate torque about the Z axis. The gap between the X stage component 88 and the X base component 90 of each X mover 82 allows for slight movement of the first stage 14 about the Z axis.

The first stage Y mover 86 selectively moves the first stage frame 40 along the Y axis relative to the stage base 12. Stated another way, the first stage Y mover 86 makes relatively slight adjustments to the position of the first stage 14 along the Y axis.

In the embodiment illustrated in FIG. 1, the first stage Y mover 86 is a non-commutated actuator, commonly referred to as a voice coil actuator. The first Y stage component 92 (illustrated in FIG. 2) is secured to the first stage frame 40, and the first Y base component 94 is secured to the stage base 12. More specifically, the first Y stage component 92 is secured to the first end block 42 with the first block mount 58, and the first Y base component 94 is secured to the first base mount 32.

In the embodiment illustrated in FIGS. 1 and 2, the first Y stage component 92 includes a conductor array 100 (illustrated in FIG. 2) having a single conductor 104 while the first Y base component 94 includes a pair of spaced apart magnet arrays 98 (only one is shown) that are secured to a "C" shaped magnet mount 105. Alternately, the configuration of the coil array and the magnet array can be reversed. Still alternately, the first stage Y mover 86 could be moved to the opposite side of the first stage frame 40.

The design of the second mover assembly 19 can be varied to suit the movement requirements of the stage assembly 10. In the embodiment illustrated in FIGS. 1 and 2, the second mover assembly 19 includes a second stage Y mover 106 that moves the second stage 16 relative to the first stage 14 along the Y axis. More specifically, in this embodiment, the second stage Y mover 106 moves the second stage frame 66 with a relatively large displacement along the Y axis.

The design of the second stage Y mover 106 can be varied to suit the movement requirements of the stage assembly 10. In the embodiments illustrated herein, the second stage Y mover 106 is a shaft type, commutated, linear motor and includes a first Y component 108 and an adjacent second Y component 110 that interact to selectively move the second stage 16 along the Y axis relative to the stage base 12 and the first stage 14.

In the design illustrated in FIGS. 1 and 2, the first Y component 108 of the second stage Y mover 106 is secured to the first stage frame 40, moves with the first stage frame 40, and is part of the first stage 14. More specifically, the first Y component 108 is secured to and extends between the end blocks 42, 44. In contrast, the second Y component 110 is secured to the second stage frame 66, moves with the second stage frame 66, and is part of the second stage 16. In this embodiment, the second Y component 110 is secured to the upper surface 78 of the stage channel 76.

One of the components 108, 110 of the second stage Y mover 106 includes one or more magnet arrays (not shown) and the other component 108, 110 includes one or more conductor arrays (not shown). In the embodiment illustrated in FIG. 1, the first Y component 108 includes a magnet array that is fixedly secured to the first stage frame 40 and the second Y component 110 includes a conductor array having a plurality of conductors. Alternately, for example, the conductor array and the magnet array can be reversed.

With this design, the second stage Y mover 106 makes relatively large displacement adjustments to the position of the device 24 along the Y axis. The required stroke of the second stage Y mover 106 along the Y axis will vary according to desired use of the stage assembly 10. For an exposure apparatus 28, generally, the stroke of the second stage Y mover 106 for moving the wafer 26 is between approximately 300 millimeters and 450 millimeters.

The measurement system 21 monitors the position of the stages 14, 16 relative to the stage base 12 or some other reference, such as a lens assembly 208 (illustrated in FIG. 8). With this information, the first mover assembly 18 and the second mover assembly 19 can be used to precisely position the stages 14, 16. Because the first stage 14 is guideless in the planar degrees of freedom, measurement of the position of the first stage 14 and the second stage 16 along the X axis, along the Y axis and about the Z axis is required to precisely position the stages 14, 16.

The design of the measurement system 21 can be varied. For example, the measurement system 21 can utilize laser interferometers, encoders, and/or other measuring devices to monitor the position of the stages 14, 16. In the embodiment illustrated in FIG. 1, the measurement system 21 includes a first system 112 and a second system 114 which collectively monitor the position of the stages 14, 16 along the X axis, the Y axis and about the Z axis. For the design illustrated in FIG. 1, the first system 112 measures the position of the second stage 16 relative to the first stage 14 along the Y axis, and the second system 114 measures the position of the second stage 16 along the Y axis, along the X axis and about the Z axis.

In the embodiment illustrated in FIG. 1, the first system 112 is commonly referred to as a linear encoder and includes a sensor 116 secured to the second stage 16 and a sensor strip 118 secured to the first stage 14. The sensor 116 measures the amount of movement of second stage 16 as the second stage 16 and the sensor 116 moves relative to the sensor strip 118. Alternately, for example, the components of the first system 112 can be reversed or an interferometer system can be utilized. A suitable interferometer system can be assembled using components available from Hewlett Packard, located in Palo Alto, Calif.

In the embodiment illustrated in FIG. 1, the second system 114 includes an XZ interferometer 120 and a Y interferometer 122. The XZ interferometer 120 includes an XZ mirror 124 and an XZ block 126. The XZ block 126 interacts with the XZ mirror 124 to monitor the location of the second stage 16 along the X axis and about the Z axis (theta Z). More specifically, the XZ block 126 generates a pair of spaced apart XZ measurement signals 125 that are reflected off of the XZ mirror 124. With this information, the location of the second stage 16 along the X axis and about the Z axis can be monitored. Further, because the second stage 16 does not move relative to the first stage 14 along the X axis or about the Z axis, the location of the first stage 14 along the X axis and about the Z axis can also be monitored by the XZ interferometer 120.

In the embodiment illustrated in the Figures, the XZ mirror 124 is rectangular shaped and extends along one side of the second stage 16. The XZ block 126 is positioned away from the second stage 16. The XZ block 126 can be secured to the apparatus frame 200 (illustrated in FIG. 8) or some other location that is isolated from vibration.

Similarly, the Y interferometer 122 includes a Y mirror 128 and a Y block 130. The Y mirror 128 interacts with the Y block 130 to monitor the position of the second stage 16 along the Y axis. More specifically, the Y block generates a Y signal 132 that is reflected off of the Y mirror 128. With this information, the location of the second stage 16 along the Y axis can be monitored. Further, because the position of the second stage 16 relative to the first stage 14 along the Y axis is measured with the first system 112, the position of the first stage 14 along the Y axis can also be monitored.

In the embodiment illustrated in the Figures, the Y mirror 128 is rectangular shaped and is positioned along one of the sides of the second stage 16. The Y block 130 is positioned away from the second stage 16. The Y block 130 can be secured to an apparatus frame 200 (illustrated in FIG. 8) or some other location that is isolated from vibration.

Alternately, for example, the first system 112 could measure the position of the first stage 14 along the Y axis, along the X axis and about the Z axis and the second system 114 could measure the position of the second stage 16 relative to the first stage 14 along the Y axis.

The control system 22 controls the first mover assembly 18 and the second mover assembly 19 to precisely position the device 24. The first stage 14 is guideless along the X axis, along the Y axis and about the Z axis. As a result thereof, the control system 22 controls the first mover assembly 18 to position the first stage 14 along the X axis, along the Y axis and about the Z axis. This allows for more accurate positioning of the stages 14, 16 and better performance of the stage assembly 10.

In the embodiment illustrated in FIGS. 1, the control system 22 directs and controls the current to X stage component 88 for each of the X mover 82, 84 to control movement of the stages 14, 16 along the X axis and about the Z axis. Similarly, the control system 22 directs and controls the current to first Y stage component 92 of the first stage Y mover 86 to control movement of the first stage 14 along the Y axis. Finally, the control system 22 directs and controls the current to the second Y component 110 for the second stage Y mover 106 to control movement of the second stage 16 along the Y axis.

Uniquely, the control system 22 adjusts the current to the X movers 82, 84 to control movement of the stages 14, 16 based on the location of the second stage 16 relative to the first stage 14 along the Y axis. More specifically, the control system 22 directs current to the X stage component 88 for each X mover 82, 84 based upon the location of a combined center of gravity 134 (illustrated in FIGS. 3A–3C) of the stages 14, 16. Stated another way, the amount of current directed to the X stage component 88 for each X mover 82, 84 varies according to the location of the combined center of gravity 134 of the stages 14, 16. Basically, the control system 22 controls the force generated by each X mover 82, 84 based upon the location of the combined center of gravity 134 of the stages 14, 16. With this design, the X movers 82, 84 do not generate unwanted torque about the Z axis and the X movers 82, 84 move the stages 14, 16 in a smooth manner along the X axis.

Figure 3A:
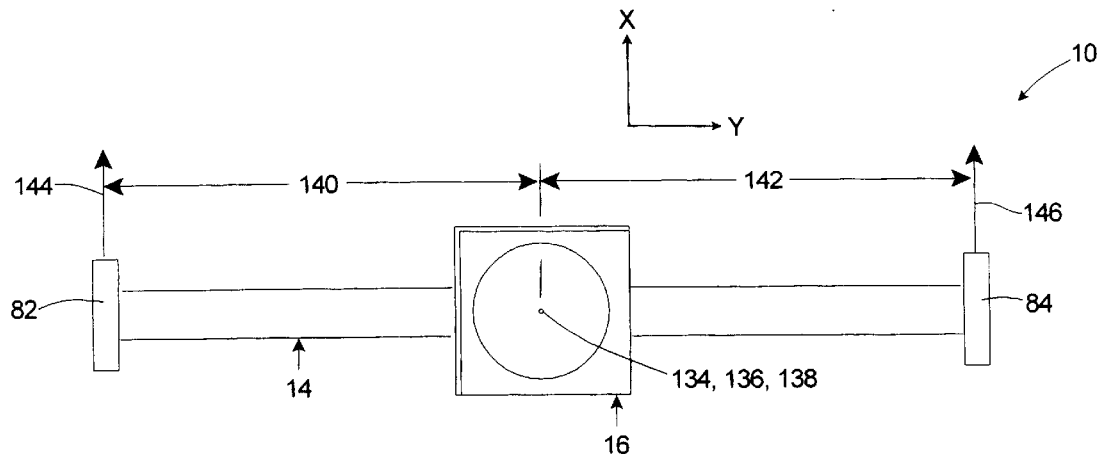
FIG. 3A is a simplified, schematic top view of a portion of a stage assembly.
Figure 3B:
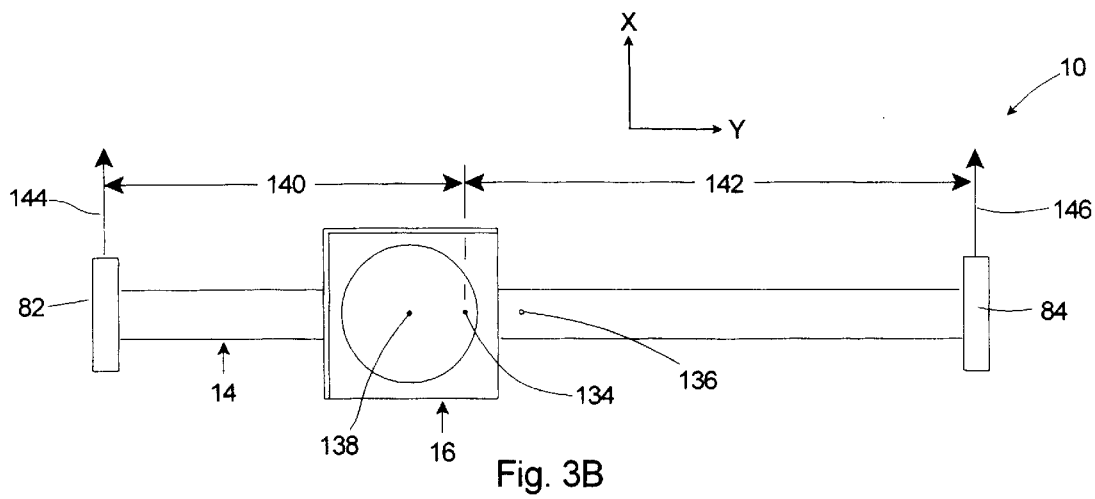
FIG. 3B is a simplified, schematic top view of a portion of a stage assembly.
Figure 3C:
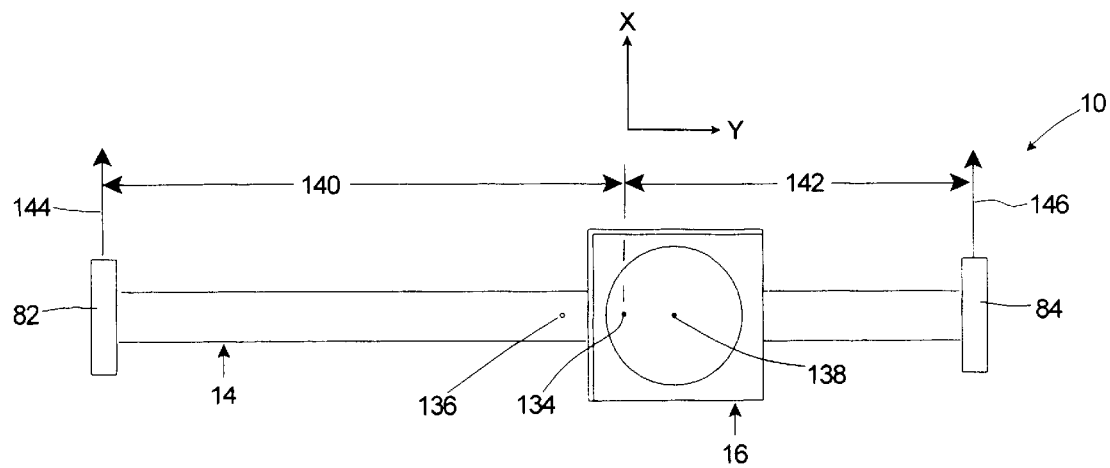
FIG. 3C is a simplified, schematic top view of a portion of a stage assembly.

FIGS. 3A–3C illustrate simplified schematic top views of a portion of a stage assembly 10 that facilitate an initial discussion of the control system 22. In particular, FIG. 3A illustrates the stage assembly 10 with the second stage 16 positioned approximately half-way between the X movers 82, 84 along the Y axis. FIG. 3B illustrates the stage assembly 10 with the second stage 16 positioned closer to the first X mover 82 than the second X mover 84 along the Y axis. FIG. 3C illustrates the stage assembly 10 with the second stage 16 positioned closer to the second X mover 84 than the first X mover 82 along the Y axis.

It should be noted in FIG. 3A, a first Y distance (Y1) 140 between the first X mover 82 and the combined center of gravity 134 along the Y axis is substantially equal to a second Y distance (Y2) 142 between the second X mover 84 and the combined center of gravity 134 along the Y axis. At this position, the combined center of gravity 134 is positioned near a first stage center 136 of the first stage 14 and a second stage center 138 of the second stage 16. Further, at this position, the control system 22 directs current to each X mover 82, 84 so that a first force (f1) 144 (illustrated as an arrow) generated by the first X mover 82 is substantially equal to a second force (f2) 146 (illustrated as an arrow) generated by the second X mover 84. Stated another way, if the combined center of gravity 134 is approximately intermediate the X movers 82, 84, during movement of the first stage 14 the current directed to each X mover 82, 84 and the force generated by each X mover 82, 84 is substantially the same.

In FIG. 3B, the first Y distance 140 between the first X mover 82 and the combined center of gravity 134 is less than the second Y distance 142 between the second X mover 84 and the combined center of gravity 134. At this position, the combined center of gravity 134 is positioned between the first stage center 136 and the second stage center 138. Further, the combined center of gravity 134 is closer to the first X mover 82 than the second X mover 84. At this position, the control system 22 directs current to each X mover 82, 84 so that the first force 144 is greater than the second force 146. Stated another way, the control system 22 controls current to the X movers 82, 84 so that the first X mover 82 generates more force than the second X mover 84 if the second stage 16 and the combined center of gravity 134 is closer to the first X mover 82 than the second X mover 84.

In FIG. 3C, the first Y distance 140 between the first X mover 82 and the combined center of gravity 134 is greater than the second Y distance 142 between the second X mover 84 and the combined center of gravity 134. In this position, the combined center of gravity 134 is positioned between the first stage center 136 and the second stage center 138. Further, the combined center of gravity 134 is closer to the second X mover 84 than the first X mover 82. At this position, the control system 22 directs current to each X mover 82, 84 so that the second force 146 is greater than the first force 144. Stated another way, the control system 22 controls current to the X movers 82, 84 so that the first X mover 82 generates less force than the second X mover 84 if the second stage 16 and the combined center of gravity 134 are closer to the second X mover 84 than the first X mover 82.

Thus, during movement of the first stage 14, the force generated by each X mover 82, 84 is varied according to the position of the combined center of gravity 134 and second stage 16 along the Y axis. As provided herein, the control system 22 controls current to the X movers 82, 84 so that (i) f1 144 increases relative to f2 146 as Y1 140 decreases and (ii) f1 144 decreases relative to f2 146 as Y1 140 increases. Stated another way, the control system 22 controls current to the X movers 82, 84 so that current to the first X mover 82 increases and current to the second X mover 84 decreases as the second stage 16 moves towards the first X mover 82. Alternately, however, current to the second X mover 84 increases and current to the first X mover 82 decreases as the second stage 16 moves towards the second X mover 84. If the second stage 16 is exactly intermediate the X movers 82, 84, the current to each X mover is substantially the same.

Figure 4A:
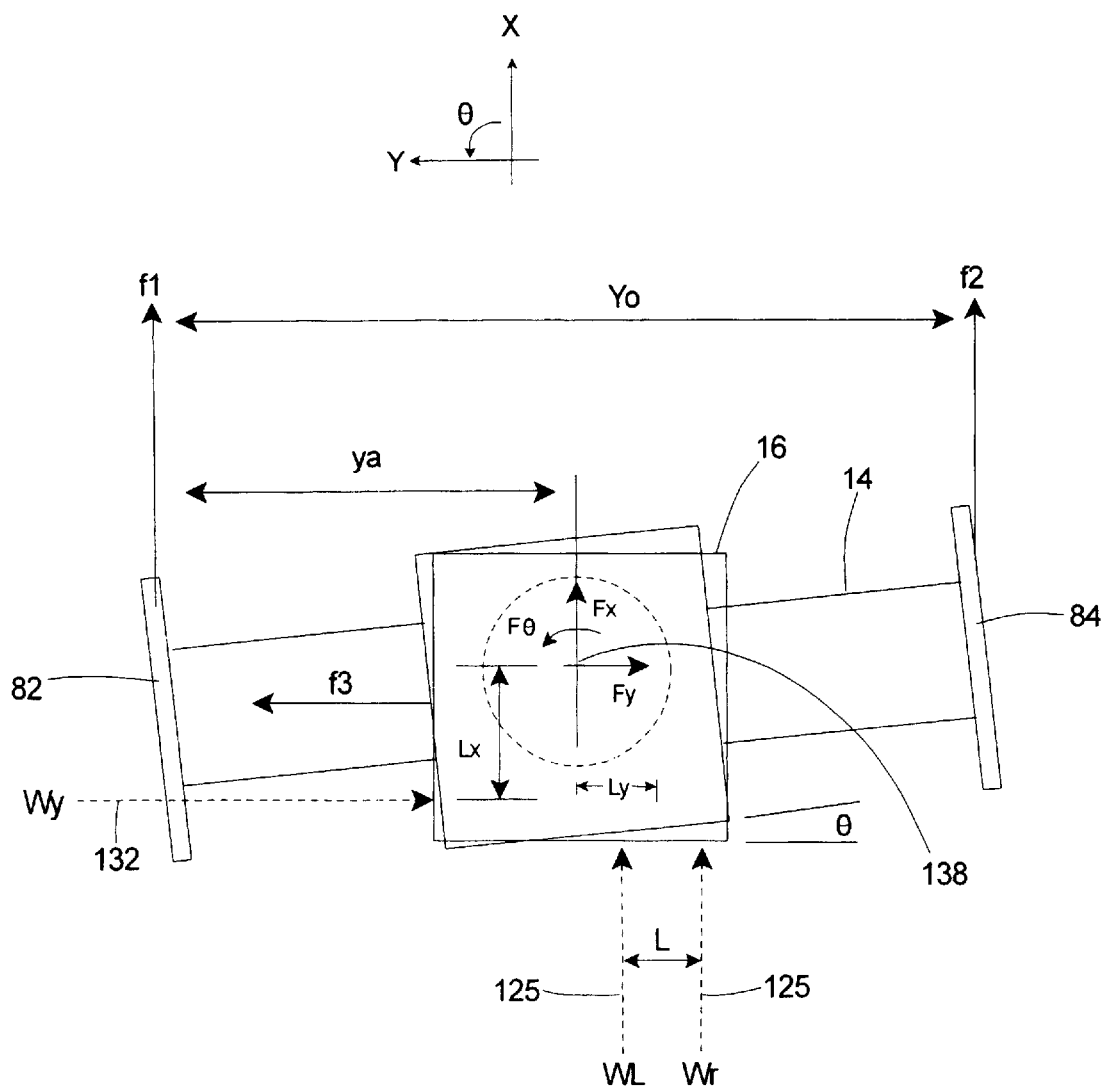
FIG. 4A is a simplified schematic top view of a portion of the stage assembly.
Figure 4B:
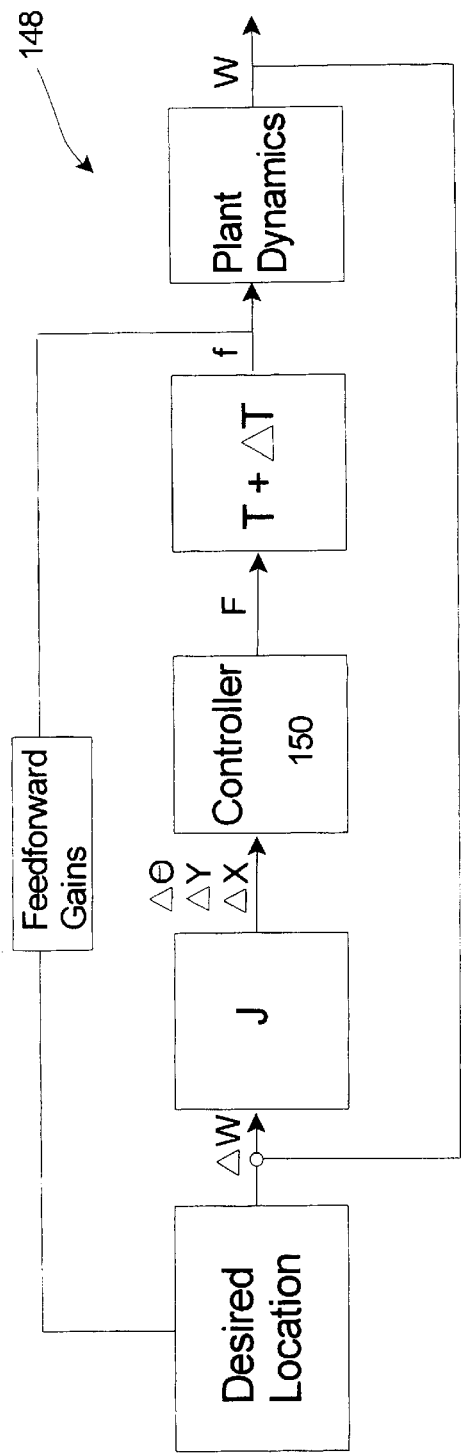
FIG. 4B is a control block diagram having features of the present invention for the stage assembly of FIG. 4A.

FIGS. 4A and 4B further facilitate discussion of the control system 22. in particular, FIG. 4A illustrates a simplified schematic top view of a portion of a stage assembly 10 including the measurement signals 125, 132 and the X movers 82, 84. FIG. 4B illustrates a control block diagram 148 for the stage assembly 10.

As provided herein, the control system 22 controls the movers 82, 84, 86 to move the combined center of gravity 134 along the desired path. The control system 22 is designed to control the movement of the combined center of gravity 134 of the stages 14, 16. Because, the combined center of gravity 134 changes as the second stage 16 moves along the Y axis, it is necessary for the control system 22 to convert the measurements taken by the measurement system 21 of the location of the second stage 16 to determine the location of the combined center of gravity 134. As a result thereof, the control system 22 continuously converts actual measurements taken by the measurement system 21 and determines the location of the combined center of gravity 134.

Additionally, because the control system 22 is designed to move and control the combined center of gravity 134, the control system 22 first determines a theoretical force (F) needed to move the combined center of gravity 134 from the present location to the desired location. This theoretical force (F) is subsequently converted to an actual force (f) at the movers 82, 84, 86 and 1 06 necessary to correctly move the combined center of gravity 134 to the desired location.

The following symbols are used in conjunction with FIGS. 4A and 4B and the discussion provided below to describe the control system:

W is actual location measured with the measurement system 21. W is determined from Wy, Wl and Wr taken by the measurement system 21.

ΔW is the error in position of the second stage 16. Stated another way, ΔW is the difference between desired location of the second stage 16 and the actual location W of the second stage 16. ΔW includes a ΔWy component, a ΔWl component, and a ΔWr component. ΔWy represents the difference between the desired location of the second stage 16 and actual location Wy along the Y axis. ΔWl and ΔWr represent the difference between desired location of the second stage 16 and actual location Wl, Wr along the X axis and about the Z axis.

X represents the location of the second stage center 138 along the X axis. Y represents the location of the second stage center 138 along the Y axis. θ represents the location of the second stage center 138 about the Z axis.

ΔX represents the difference between the desired location of the second stage center 138 and the actual location X of the second stage center 138 along the X axis. ΔY represents the difference between the desired location of the second stage center 138 and the actual location Y of the second stage center 138 along the Y axis. Δθ represents the difference between the desired location of the second stage center 138 and the actual location θ of the second stage center 138 about the Z axis.

F represents a theoretical force required to move the combined center of gravity 134 from the present location to the desired location. F can be broken down into three components, namely Fx, Fy and Fθ. Fx represents a theoretical force required to move the combined center of gravity 134 from the present location to the desired location along the X axis. Fy represents a theoretical force required to move the combined center of gravity 134 from the present location to the desired location along the Y axis. Fθ represents a theoretical force required to move the combined center of gravity 134 from the present location to the desired location about the Z axis.

f represents the force required at the movers 82, 84, 86, and 106 to move the combined center of gravity 134 from the present location to the desired location. With the stage assembly 10 illustrated herein, the f can be divided into three components, namely f1, f2 and f3. f1 represents a force required by the first X mover 82 to move the combined center of gravity 134 from the present location to the desired location. f2 represents a force required by the second X mover 84 to move the combined center of gravity 134 from the present location to the desired location. f3 represents a force required by the second stage Y mover 106 to move the combined center of gravity 134 from the present location to the desired location.

Referring to FIG. 4A, the differential (Jacobian) relationship between mirror measurement points and the location of the second stage center 138 can be calculated by the following:

$$\Delta W y \sim \Delta y - lx\Delta\theta$$

$$\Delta W x_1 \sim \Delta x + (ly + L/2)\Delta\theta$$

$$\Delta W x_2 \sim \Delta x + (ly - L/2)\Delta\theta$$

$$\Delta W = J \Delta X$$

$$J = \begin{bmatrix} 1 & 0 & -lx \\ 0 & 1 & ly + L/2 \\ 0 & 1 & ly - L/2 \end{bmatrix}$$

$$J^{-1} = \begin{bmatrix} 1 & lx/L & -lx/L \\ 0 & \frac{1}{2} + ly/L & \frac{1}{2} - ly/L \\ 0 & 1/L & -1/L \end{bmatrix}$$

The conversion of the theoretical Force (F) at the second stage center 138 to the actual f at the movers 82, 84, 86, 106 can be calculated as follows:

$$f_1 = Fx + F_\theta/(Y_o - y_a)$$

$$f_2 = Fx - F_\theta/y_a$$

$$f_3 = Fy$$

When $y_a$ is $y_a$ function of Y.

$$f = T(x,y)F$$

From a practical point of view, the second stage center 138 is not equivalent to the combined center of gravity 134. Therefore, an additional term, ΔT, is included into the force distribution:

$$f = [T + \Delta T]F$$

where $$T = \begin{bmatrix} 0 & 1 & 1/(Y_o - y_a) \\ 0 & 1 & -1/y_a \\ 1 & 0 & 0 \end{bmatrix}$$

$$\Delta T = \begin{bmatrix} 0 & Kx(y) & 0 \\ 0 & -Kx(y) & 0 \\ Ky & 0 & 0 \end{bmatrix}$$

Ky is a constant number, because the filter output force is a fixed distance from the combined center of gravity 134. Kx(y) is a first order linear function of y in this case. As the second stage 16 moves along the y axis, Kx(y) will change linearly.

FIG. 4B illustrates the control block diagram 148 for the stage assembly 10. The desired position is described in the same coordinate frame as is measured by the measurement system 21. First, the control system 22 calculates ΔW (the difference between the desired position and the measured location W of the second stage 16). Next, ΔW is transformed as described above into ΔX (the difference between the desired location and the actual location of the second stage center 138). With ΔX, the control system 22 utilizes a controller 150 to determine the theoretical force (F) required to move stage assembly 10 to the desired position. The theoretical force F is transformed into the actual force f required at the movers 82, 84, 86, and 106. These forces f1, f2, f3 are applied to the movers 82, 84, 86, 106, and the error signal changes. The feed forward loop improves the performance of the stage assembly 10 during acceleration.

Figure 4C:
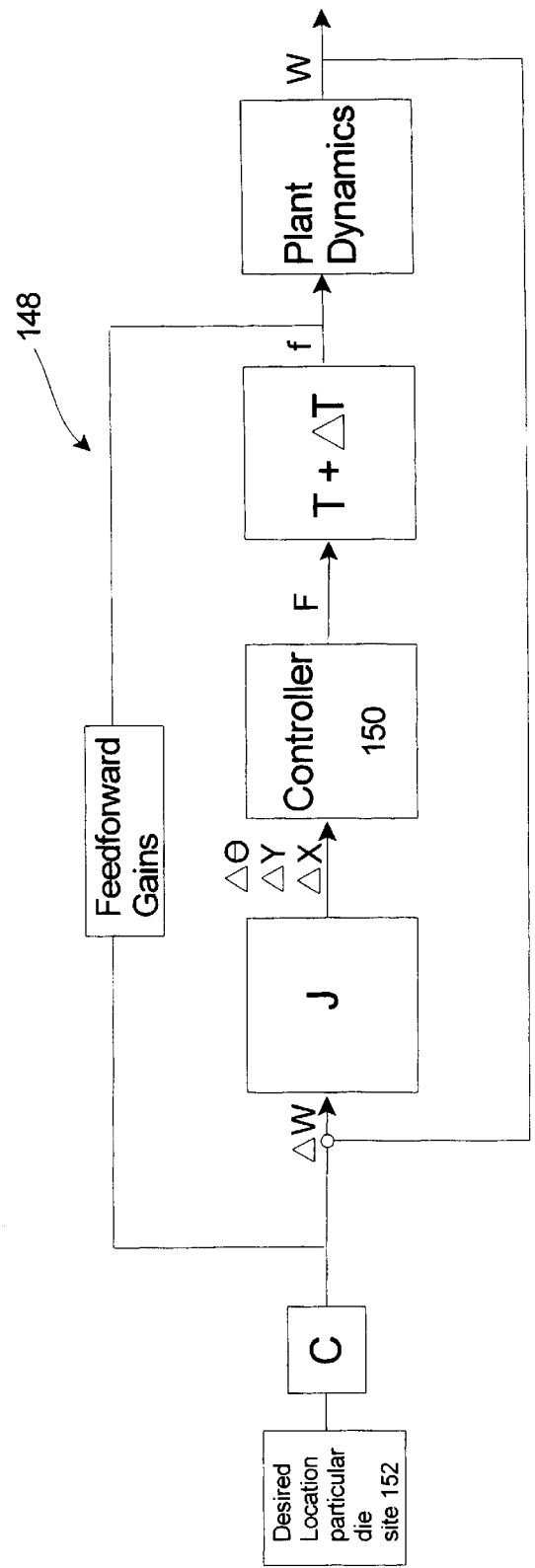
FIG. 4C is another embodiment of a control block diagram having features of the present invention.

Alternately, with the teaching provided herein, the control system 22 can be designed to servo any point to follow any trajectory, not just control the center of gravity 134. For example, the present design allows the control system 22 to servo based upon the different die sites of the wafer. For example, FIG. 4C illustrates a particular die site 152. The die site 152 illustrated in FIG. 4C can be varied.

FIG. 4C illustrates a control block diagram 148 of the control system 22 when the control system 22 controls trajectory of the particular die site 152. The block diagram 148 of FIG. 4C differs from that if FIG. 4B that an additional coordinate transformation "C" is necessary in order to convert the desired location of the particular die site 152 into the coordinate system utilized by the measurement system.

FIG. 5 illustrates a second embodiment of the stage assembly 10. FIG. 6 illustrates the main moving components of the stage assembly 10 of FIG. 5. The stage assembly 10 illustrated in FIG. 5 includes the stage base 12, the first stage 14, the second stage 16, the first mover assembly 18, the second mover assembly 19, the measurement system 21 and the control system 22.

The embodiment illustrated in FIG. 5 differs from the embodiment illustrated in FIG. 1 in that the stage assembly 10 in FIG. 5 also includes a reaction stage 160. The reaction stage 160 is positioned between the first stage 14 and the second stage 16. Referring to FIG. 6, the reaction stage 160 includes a reaction stage frame 161 and the first Y component 108 of the second stage Y mover 106. The reaction stage frame 161 includes a first frame end 162 and a second frame end 164 that are attached together with the first Y component 108 of the second stage Y mover 106. Each frame end 162, 164 includes an upper beam 166 and a pair of spaced apart, side beams 168 that extend downwardly from the upper beam 166.

Additionally, in this embodiment, each side beam 168 includes a plurality of spaced apart, fluid outlets (not shown). Pressurized fluid (not shown) is released from the fluid outlets towards the bar bearing surface 62 of each guide bar 46 to create a fluid bearing between the frame ends 162, 164 and the guide bars 46. The fluid bearing maintains the reaction stage 160 spaced apart from the first stage 14 along the X axis, and allows for motion of the reaction stage 160 and the first Y component 108 of the second stage Y mover 106 along the Y axis relative to the first stage 14. This design allows the reaction forces from the second stage Y mover 106 to be transferred away from the first stage 14. Stated another way, this arrangement allows the reaction forces of the second stage Y mover to react directly with the ground or the stage base 12. This results in less excitement of the first stage 14.

Preferably, the stage assembly 10 illustrated in FIG. 5 also includes a trim mover 170 that is attached to the reaction stage 160 and the reaction frame 202 (illustrated in FIG. 8). The trim mover 170 transfers the reaction forces from the reaction stage 160 to the reaction frame 202. In the embodiment illustrated in FIGS. 5 and 6, the trim mover 170 is commonly referred to as a voice coil actuator and includes a first trim component 172 and a second trim component 174. In the embodiment illustrated, the first trim component 172 is "C" shaped and includes a pair of spaced apart magnet arrays 154, and the second trim component 174 is "T" shaped an includes a conductor array 156 (having a conductor 158). The first trim component 172 can be secured to the reaction frame to transfer reaction forces to the mounting base 20.

Additionally, in the embodiment illustrated in FIGS. 5 and 6, the first stage Y mover 86 is moved to the opposite side of the stage assembly 10. In particular, the first Y stage component 92 is secured to the second end block 44, and the first Y base component 94 is secured to the second base mount 34.

Figure 7A:
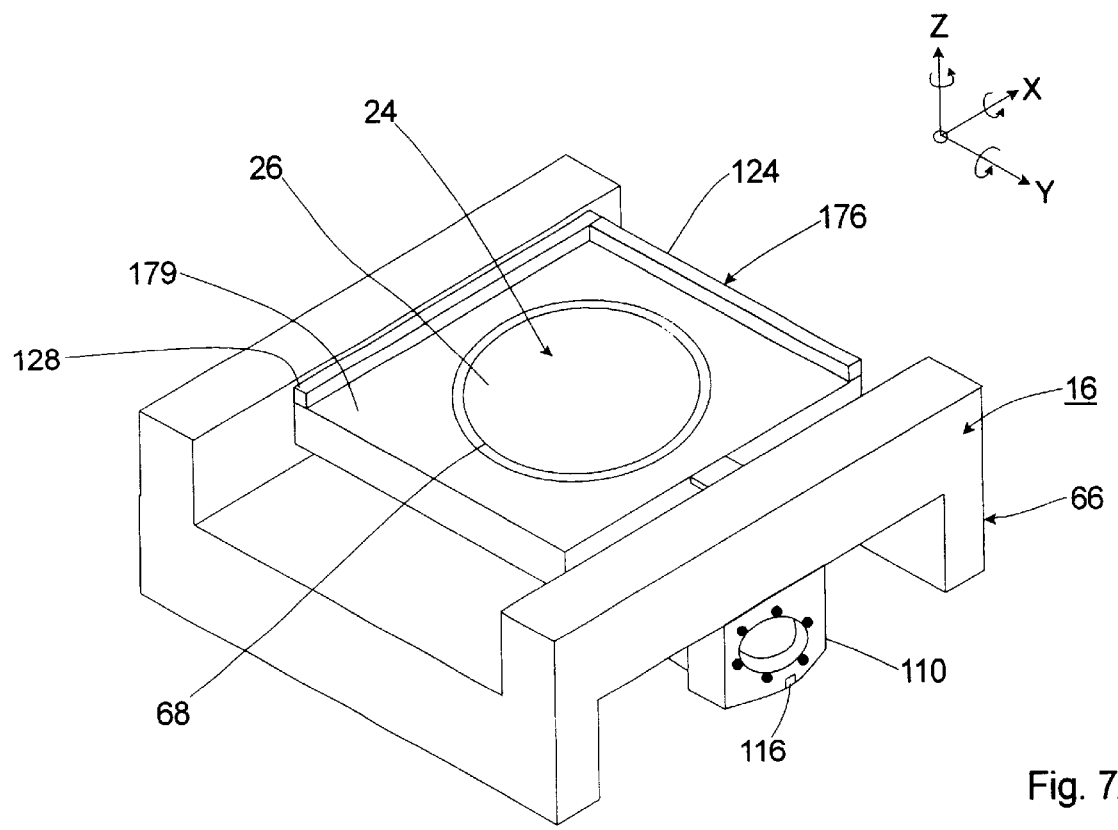
FIG. 7A is a perspective view of an alternate embodiment of a portion of the stage assembly.
Figure 7B:
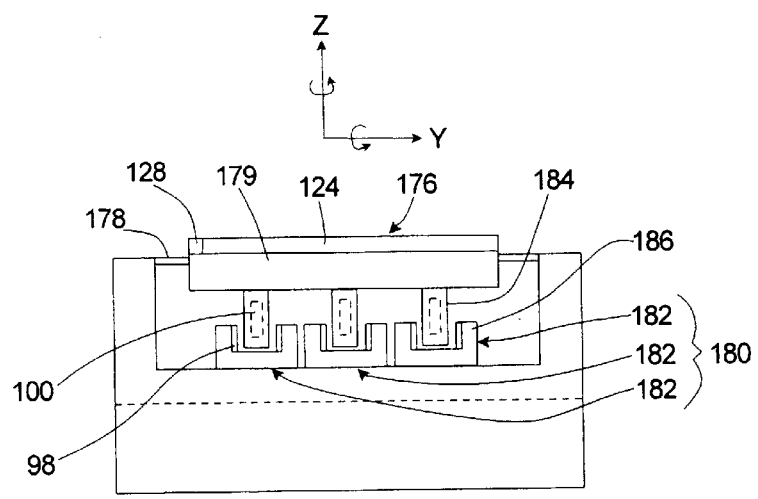
FIG. 7B is a side plan view of the portion of the stage assembly of FIG. 7A.

FIGS. 7A and 7B, illustrate an alternate embodiment of a portion of the stage assembly 10. In this embodiment, a third stage 176 is secured to the second stage 16 with a plurality of stage connectors 178. The third stage 176 moves with the second stage 16 along the X axis, along the Y axis and about the Z axis. However, the third stage 176 moves relative to the second stage 16 about the X axis, about the Y axis and along the Z axis relative to the second stage frame 66. In this embodiment the device holder 68 is secured to the third stage 176 instead of the second stage 16.

In the embodiment illustrated in FIGS. 7A and 7B, the third stage 176 includes a rectangular shaped, third stage frame 179 that is secured to the second stage 16 with the stage connectors 178. The third stage frame 179 moves relative to the second stage 16 with a third mover assembly 180. The stage connectors 178 allow for movement of the third stage 176 about the X axis, about the Y axis and along the Z axis relative to the second stage 16. However, the stage connectors 178 inhibit movement of the third stage 176 relative to the second stage 16 along the X axis, along the Y axis and about the Z axis relative to the second stage 16. In the embodiment illustrated in the FIGS. 7A and 7B, the stage connectors 178 are flat leaf springs.

The third mover assembly 180 moves the third stage 176 about the X axis, about the Y axis and along the Z axis relative to the second stage 16. The design of the third mover assembly 180 can be varied to suit the movement requirements of the stage assembly 10. In the embodiment illustrated in FIG. 7B, the third mover assembly 180 includes three, spaced apart, Z movers 182 that selectively move the third stage 176 about the X axis, about the Y axis and along the Z axis relative to the second stage 16.

The design of each Z mover 182 can be varied to suit the movement requirements of the stage assembly 10. As provided herein, each Z mover 182 includes a first Z component 184 and a second Z component 186. In the embodiments illustrated in the FIG. 7B each Z mover 182 is a non-commutated actuator, commonly referred to as a voice coil actuator. For each Z mover 182, the first Z component 184 is secured to the third stage frame 179 and the second Z component 186 is secured to the second stage frame 66. In this embodiment, the first Z component 184 of each Z mover 182 includes a conductor array 100 (in phantom) having a single conductor 104 (in phantom) while the second Z component 186 includes a pair of spaced apart magnet arrays 98. Alternately, the configuration of the coil array and the magnet array can be reversed.

Electrical current (not shown) is individually supplied to each conductor 104 in each conductor array 100 by the control system 22. For each Z mover 182 the electrical current in each conductor 104 interacts with a magnetic field (not shown) generated by the one or more of the magnets 102 in the magnet array 98. This causes a force (Lorentz force) between the conductors 104 and the magnets 102 that can be used to move the third stage 176 relative to the second stage 16.

Figure 7C:
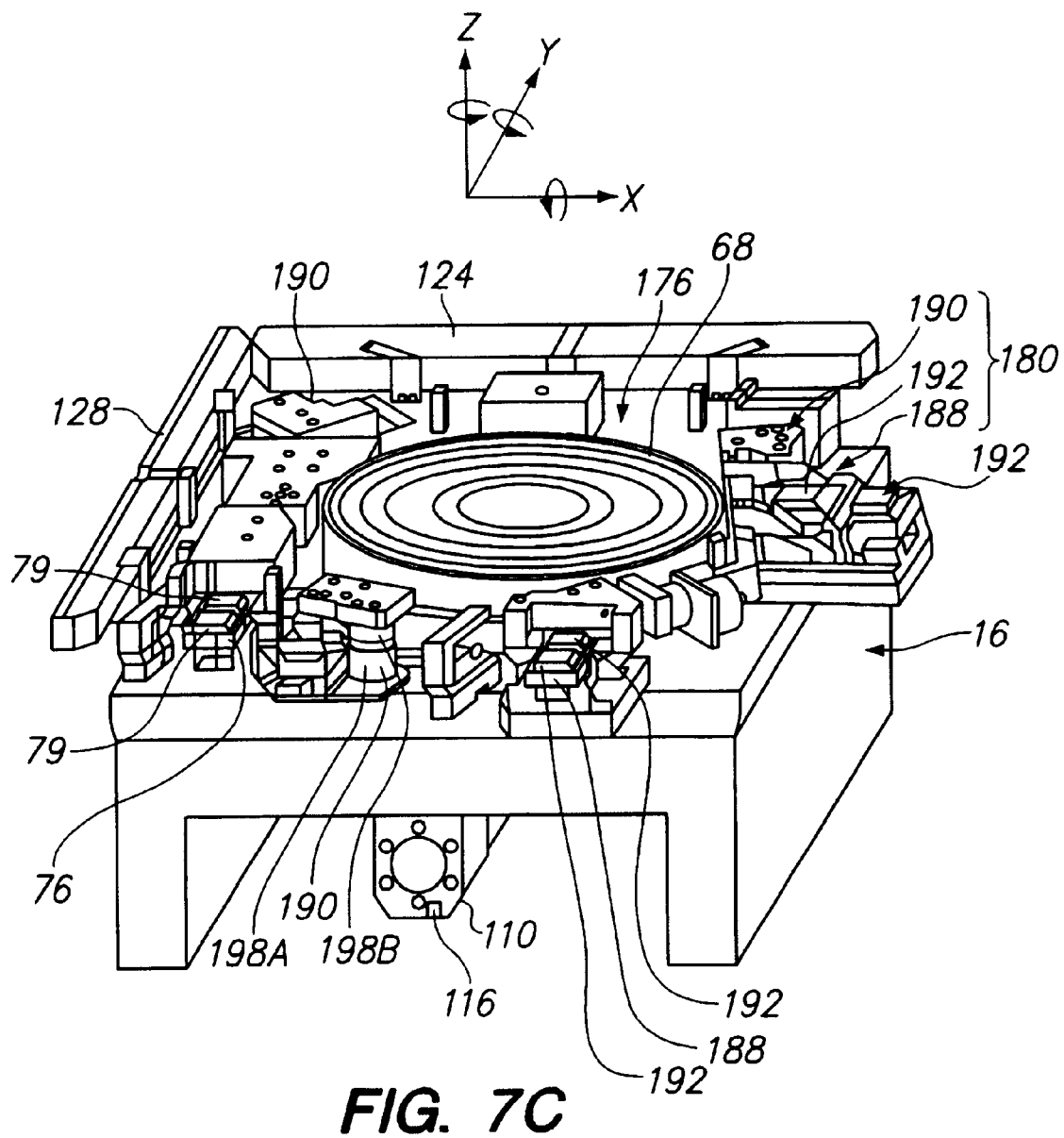
FIG. 7C is a perspective view of another alternative embodiment of a portion of a stage assembly.
Figure 7D:
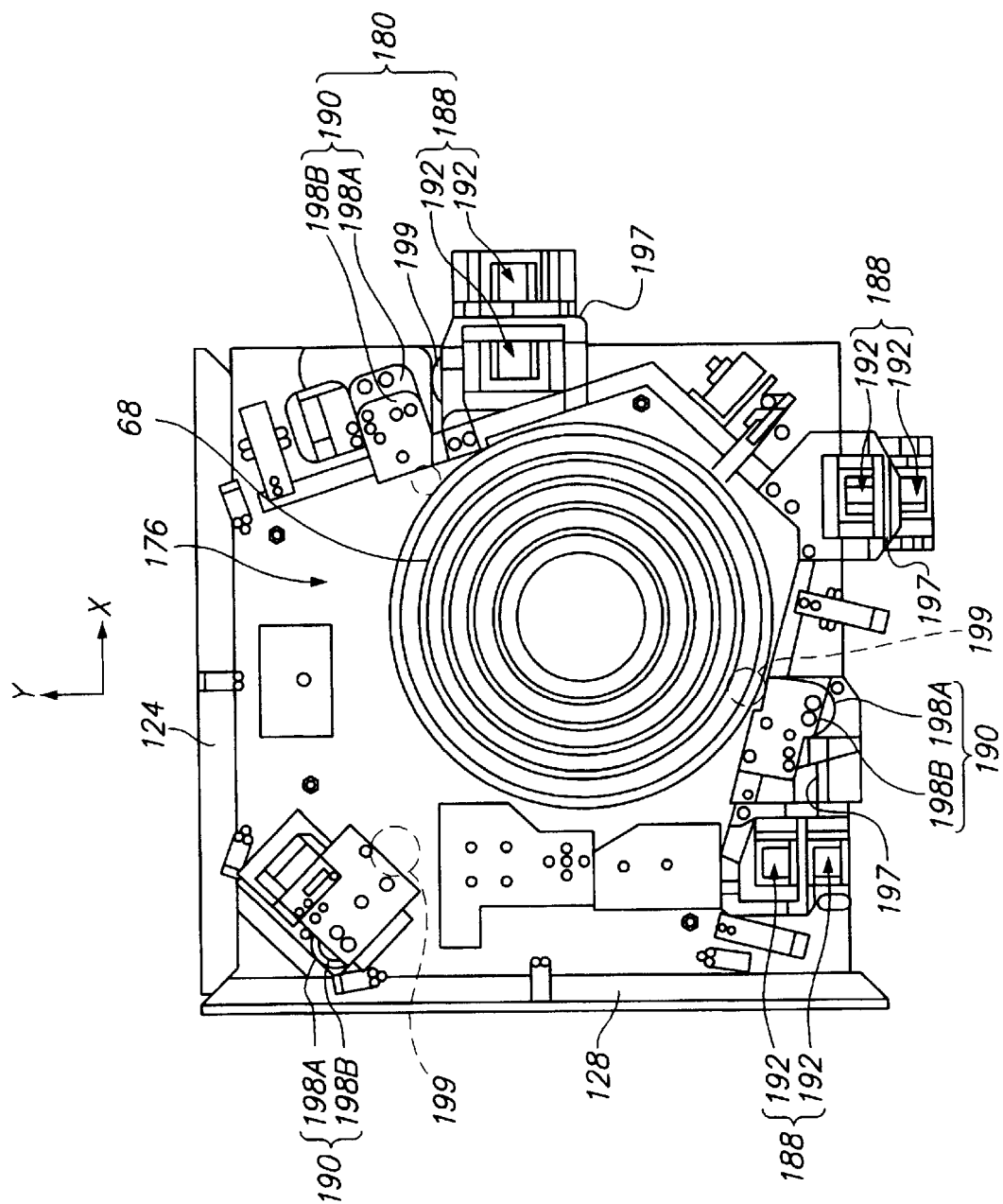
FIG. 7D is a top plan view of the portion of the stage assembly of FIG. 7C.

FIGS. 7C and 7D illustrate another alternate embodiment of a portion of the stage assembly 10. In this embodiment, a third stage 176 is moved relative to the second stage 16 with the third mover assembly 180. More specifically, the third mover assembly 180 adjusts the position of the third stage 176 relative to the second stage 16 of the stage assembly 10.

In the embodiment illustrated in FIGS. 7C and 7D, the third mover assembly 180 adjusts the position of the third stage 176 and the device holder 68 relative to the second stage 16 with six degrees of freedom. The third mover assembly 180 can include one or more rotary motors, voice coil motors, linear motors and/or attraction only actuators.

In the embodiment illustrated in FIGS. 7C and 7D, the third mover assembly 180 includes three spaced apart, horizontal movers 188 and three spaced apart, vertical movers 190. The horizontal movers 188 move the third stage 176 along the X axis, along the Y axis and about the Z axis relative to the second stage 16. Alternately, the vertical movers 190 move the third stage 176 about the X axis, about the Y axis and along the Z axis relative to the second stage 14.

The design of each mover 188, 190 can be varied. In the embodiment illustrated in the Figures, each of the horizontal movers 188 includes a pair of attraction only actuators 192 and each of the vertical movers 190 is a non-commutated actuator, commonly referred to as a voice coil actuator.

Figure 7E:
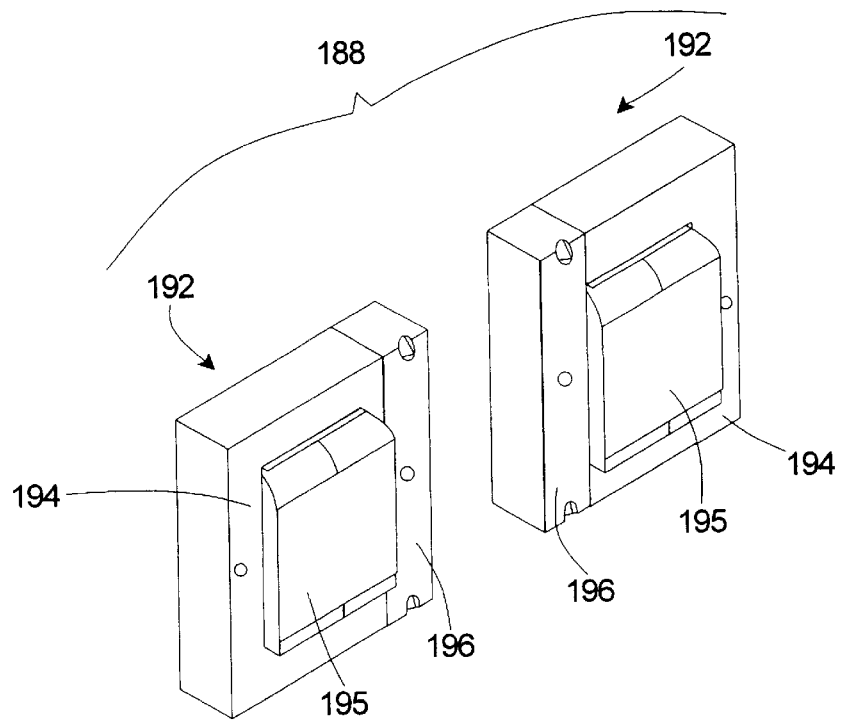
FIG. 7E illustrates a perspective view of a pair of attraction type actuators having features of the present invention.
Figure 7F:
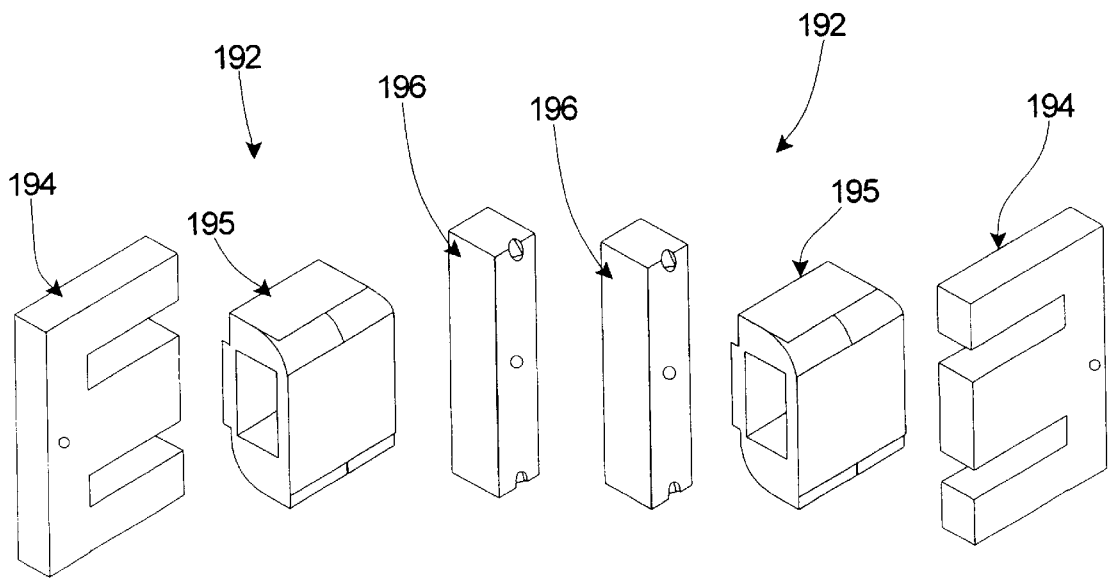
FIG. 7F illustrates an exploded perspective view of the actuators of FIG. 7E.

FIGS. 7E and 7F illustrate a perspective view of a preferred pair of attraction only type actuators 192. More specifically, FIG. 7E illustrates a perspective view of a pair of attraction only actuator 192 commonly referred to as an E/I core actuators and FIG. 7F illustrates an exploded perspective view of the E/I core actuators. Each E/I core actuator is essentially an electo-magnetic attractive device. Each E/I core actuator includes an E shaped core 194, a tubular conductor 195, and an I shaped core 196. The E core 194 and the I core 196 are each made of a magnetic material such as iron, silicon steel or Ni—Fe steel. The conductor 195 is positioned around the center bar of the E core 194. The combination of the E core 194 and the conductor 195 is sometimes referred to herein as an electromagnet. Further, the I core 196 is sometimes referred to herein as a target.

Each electromagnet and target is separated by an air gap g (which is very small and therefore difficult to see in the figures). The electromagnets are variable reluctance actuating portions and the reluctance varies with the distance defined by the gap g, which, of course also varies the flux and force applied to the target. The attractive force between the electromagnet and the target is defined by:

$$F = K(i/g)^2$$

Where F is the attractive force, measured in Newtons;
K=an electromagnetic constant which is dependent upon the geometries of the E-shaped electromagnet, I-shaped target and number of conductor turns about the magnet. $K=\frac{1}{2}N^2\mu_o wd$; where N=the number of turns about the E-shaped magnet core; $\mu_o$=a physical constant of about $1.26 \times 10^{-6}$ H/m; w=the half width of the center of the E-shaped core in meters; and d=the depth of the enter of the E-shaped core in meters. In a preferred embodiment, $K=7.73 \times 10^{-6}$ kg m$^3$/s$^2$A$^2$;
i=current, measured in amperes; and
g=the gap distance, measured in meter.

Current (not shown) directed through the conductor 195 creates an lectro-magnetic field that attracts the I core 196 towards the E core 194. The mount of current determines the amount of attraction. Stated another way, when he conductor of an electromagnet is energized, the electromagnet generates a lux that produces an attractive force on the target in accordance with the formula given above, thereby functioning as a linear actuating portion. Because the electromagnets can only attract the targets, they must be assembled in pairs that can pull in opposition. The targets are fixed to the third stage 176 and move relative to the second stage 16. Opposing pairs of electromagnets are secured to the second stage 16 on opposite sides of the targets. By making a current through the one conductor 195 of the pair of electromagnets larger than the current through the other conductor 195 in the pair, a differential force can be produced the draws the target in one direction or its opposing direction.

Preferably, the targets are attached to the third stage 176 in such a way that the pulling forces of the opposing pair of electromagnets do not distort the third stage 176. This is preferably accomplished by mounting the targets for an opposing pair of electromagnets very close to one another, preferably peripherally of the third stage 176. Most preferred is to extend a thin web 197 of material (FIG. 7D) that is made of the same material as the third stage 176. The opposing electromagnets are mounted on the second stage 16 by a predetermined distance. When the web 197 and targets are positioned there between, a predetermined gap g is formed between each set of electromagnet and target. With this arrangement, only the resultant force, derived from the sum of the forces produced by the pair of electromagnets and targets, is applied to the third stage 176 via transfer of the force through the web 197. In this way, pposing forces are not applied to opposite sides of the third stage 176 and stage distortion problems resulting from that type of arrangement are avoided.

FIG. 7D illustrates a preferred arrangement of the horizontal movers 188. In this design, one opposing pair of attraction only actuators 192 are mounted so that the attractive forces produced thereby are substantially parallel with the X axis. Two opposing pairs of attraction only actuators 192 are mounted so that attractive forces from each pair are produced substantially parallel with the Y axis. With this arrangement, the horizontal movers 188 can make fine adjustments to the position of the third stage 176 relative to the second stage 16 along the X axis, along the Y axis, and about the Z axis. More specifically, actuation of the single pair of attraction only actuators 192 aligned along the X axis can achieve fine movements of the third stage 176 along the X axis. Actuation of the two pairs of attraction only actuators 192 aligned along the Y axis can control fine movements of the third stage 176 along the Y axis or in rotation (clockwise or counterclockwise) in the X–Y plane (i.e., Theta Z control). Y axis movements are accomplished by resultant forces from both pairs that are substantially equal and in the same direction. Theta Z movements are generally accomplished by producing opposite directional forces from the two pairs of electromagnets, although unequal forces in the same direction will also cause some Theta Z adjustment.

Alternately, for example, two opposing pairs of attraction only actuators can be mounted parallel with the X direction and one opposing pair of attraction only actuators could be mounted parallel with the Y direction. Other arrangements are also possible, but the preferred arrangement minimizes the number of actuating portions/bearings required for the necessary degrees of control.

Preferably, the lines of force of the attraction only actuators 192 are arranged to act through the center of gravity of the third stage 176. The two Y pairs of attraction only actuators 102 are preferably equidistant from the center of gravity of the third stage 176.

The vertical movers 190 are used to precisely position the third stage 176 relative to the second stage 14 along the Z axis, about the X axis and about the Y axis (collectively referred to as "vertical degrees of freedom"). Because control in the three vertical degrees of freedom requires less dynamic performance (e.g., acceleration requirements are relatively low) and is easier to accomplish, lower force requirements exist than in the previously described X, Y, and Theta Z degrees of freedom. Accordingly, three voice coil motors can be used as the vertical movers 190 to adjust the position of the third stage 176 in the vertical degrees of freedom. In this design, each motor includes a magnet array 198A attached to the second stage 14 and a conductor array 198B attached to the third stage 176.

Preferably, fluid bellows 199 (illustrated in phantom) are utilized to support the dead weight of the third stage 176. The fluid bellows 199 prevent overheating of the vertical movers 190. As provided herein, a fluid bellow 199 is preferably positioned next to each vertical mover 190. The bellows 190 have very low stiffness in all degrees of freedom so they do not significantly interfere with the control of the third stage 176.

In the embodiment illustrated in FIGS. 7C and 7D, the measurement system 21 preferably includes one or more sensors (not shown) that monitor the position of the third stage 178 relative to the second stage 14.

Figure 7G:
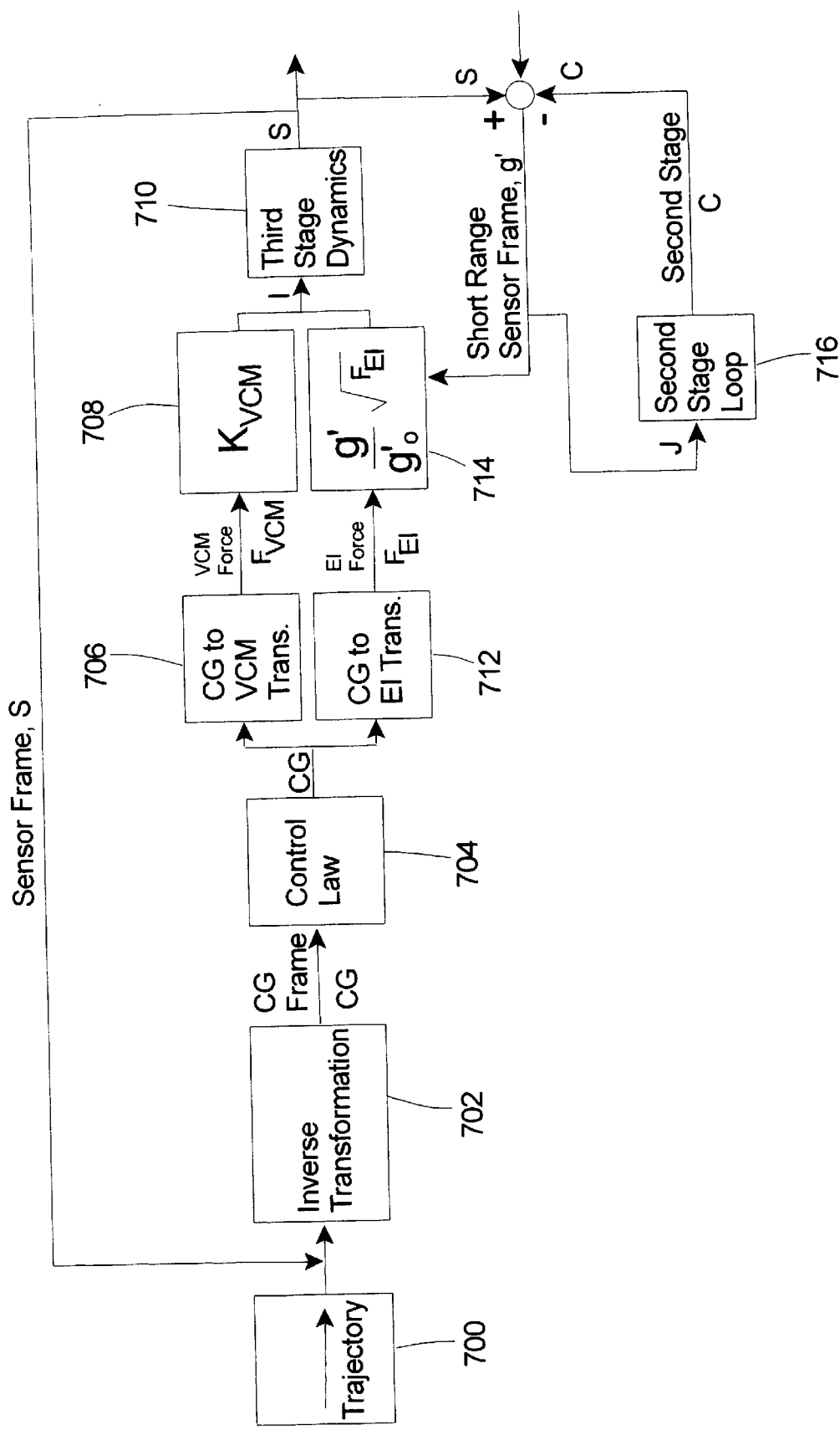
FIG. 7G is a simplified block diagram that illustrates the opperation of the control system.

FIG. 7G is a schematic that describes the sensing and control functions for the embodiment illustrated in FIGS. 7C and 7D. The sensing and control functions are more thoroughly described in co-pending U.S. patent application Ser. Nos. 09/022,713 field Feb. 12, 1998, 091139,954 filed Aug. 25, 1998, and 09/141,762 filed Aug. 27, 1998, each of which is hereby incorporated by reference thereto, in their entireties. A trajectory 700, or desired path for the focused optical system to follow is determined based on the desired path of the wafer or other object to which the focused optical system is to be applied. The trajectory 700 is next fed into the control system 22. The trajectory 700 is compared with a sensor signal vector S that is generated from the output of the measurement system 21. The difference vector, which results from the comparison, is transformed to a CG coordinate frame though an inverse transformation 702. The control law 704 prescribes the corrective action for the signal. The control law 704 may be in the form of a PID (proportional integral derivative) controller, proportional gain controller or preferably a lead-lag filter, or other commonly known law in the art of control, for example.

The vector for vertical motion is fed to the CG to VCM transformation 706. This transforms the CG signal to a value of force to be generated by the VOMs, which is then fed to the VCM gain 708, and output to the stage hardware 712. The vector for planar motion is fed to the CD to EI-core transformation 712. This transforms the CG signal to a force to be generated by the EI-core force (i.e., electromagnet and target arrangements). Because the EI-core force depends upon the gap squared, it is compensated by the short range sensor vector g through the compensation block 714, to produce a linear output to the stage hardware 710. The stage hardware 710 responds to the input and is measured in the sensor frame S. The second stage loop 716 is discussed above and illustrated in FIGS. 4B and 4C. The second stage 14 is also computed using the third stage 176 and the gap g. More specifically, the second stage 14 is servoed to follow the third stage 176.

FIG. 8 is a schematic view illustrating an exposure apparatus 28 useful with the present invention. The exposure apparatus 28 includes an apparatus frame 200, a reaction frame 202, an illumination system 204 (irradiation apparatus), a reticle stage assembly 206, a lens assembly 208, and a wafer stage assembly 210. The stage assemblies 10 provided herein can be used as the wafer stage assembly 210.

The exposure apparatus 28 is particularly useful as a lithographic device that transfers a pattern (not shown) of an integrated circuit from a reticle 30 onto the semiconductor wafer 26. The exposure apparatus 28 mounts to the mounting base 20, e.g., the ground, a base, or floor or some other supporting structure.

The apparatus frame 200 is rigid and supports the components of the exposure apparatus 28. The design of the apparatus frame 200 can be varied to suit the design requirements for the rest of the exposure apparatus 28. The apparatus frame 200 illustrated in FIG. 8 supports the lens assembly 208 and the illumination system 204 above the mounting base 20.

The illumination system 204 includes an illumination source 212 and an illumination optical assembly 214. The illumination source 212 emits a beam (irradiation) of light energy. The illumination optical assembly 214 guides the beam of light energy from the illumination source 212 to the lens assembly 208. The beam illuminates selectively different portions of the reticle and exposes the wafer. In FIG. 8, the illumination source 212 is illustrated as being supported above the reticle stage assembly 206. Typically, however, the illumination source 212 is secured to one of the sides of the apparatus frame 200 and the energy beam from the illumination source 212 is directed to above the reticle stage assembly 206 with the illumination optical assembly 214.

The lens assembly 208 projects and/or focuses the light passing through the reticle to the wafer. Depending upon the design of the exposure apparatus 28, the lens assembly 208 can magnify or reduce the image illuminated on the reticle.

The reticle stage assembly 206 holds and positions the reticle 30 relative to the lens assembly 208 and the wafer 26. Similarly, the wafer stage assembly 210 holds and positions the wafer 26 with respect to the projected image of the illuminated portions of the reticle 30. In FIG. 8, the wafer stage assembly 210 utilizes a stage assembly 10 having features of the present invention. Depending upon the design, the exposure apparatus 28 can also include additional motors to move the stage assemblies 210, 206. Therefore, the present invention can also be applied to the reticle stage assembly 206 to position the reticle accuracy.

There are a number of different types of lithographic devices. For example, the exposure apparatus 28 can be used as scanning type photolithography system that exposes the pattern from the reticle onto the wafer with the reticle and wafer moving synchronously. In a scanning type lithographic device, the reticle is moved perpendicular to an optical axis of the lens assembly 208 by the reticle stage assembly 206 and the wafer is moved perpendicular to an optical axis of the lens assembly 208 by the wafer stage assembly 210. Scanning of the reticle and the wafer occurs while the reticle and the wafer are moving synchronously.

Alternately, the exposure apparatus 28 can be a step-and-repeat type photolithography system that exposes the reticle while the reticle and the wafer are stationary. In the step and repeat process, the wafer is in a constant position relative to the reticle and the lens assembly 208 during the exposure of an individual field. Subsequently, between consecutive exposure steps, the wafer is consecutively moved by the wafer stage perpendicular to the optical axis of the lens assembly 208 so that the next field of the wafer is brought into position relative to the lens assembly 208 and the reticle for exposure. Following this process, the images on the reticle are sequentially exposed onto the fields of the wafer so that the next field of the wafer is brought into position relative to the lens assembly 208 and the reticle.

However, the use of the exposure apparatus 28 provided herein is not limited to a photolithography system for semiconductor manufacturing. The exposure apparatus 28, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, electric razors, machine tools, metal cutting machines, inspection machines and disk drives.

The illumination source 212 can be g-line (436 nm), i-line (365 nm), KrF excimer laser (248 nm), ArF excimer laser (193 nm) and $F_{2\ laser}$ (157 nm). Alternately, the illumination source 212 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the lens assembly 208 included in the photolithography system, the lens assembly 208 need not be limited to a reduction system. It could also be a 1x or magnification system.

With respect to a lens assembly 208, when far ultra-violet rays such as the excimer laser is used, glass materials such as quartz and fluorite that transmit far ultra-violet rays is preferable to be used. When the $F_2$ type laser or x-ray is used, the lens assembly 208 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No, 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see US Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage which uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 9:
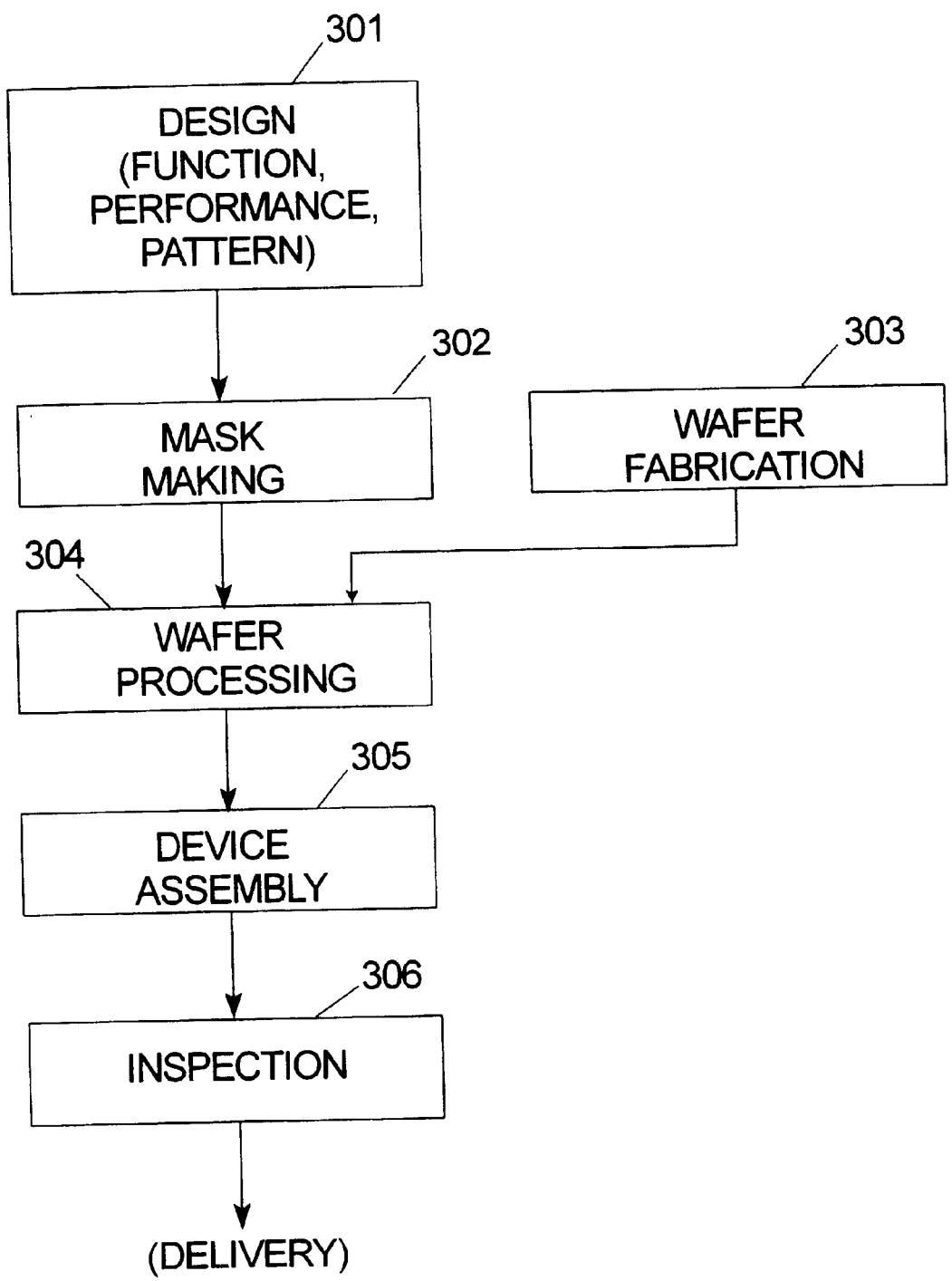
FIG. 9 is a flow chart that outlines a process for manufacturing a device in accordance with the present invention.

Further, semiconductor devices can be fabricated using the above described systems, by the process shown generally in FIG. 9. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), then finally the device is inspected in step 306.

Figure 10:
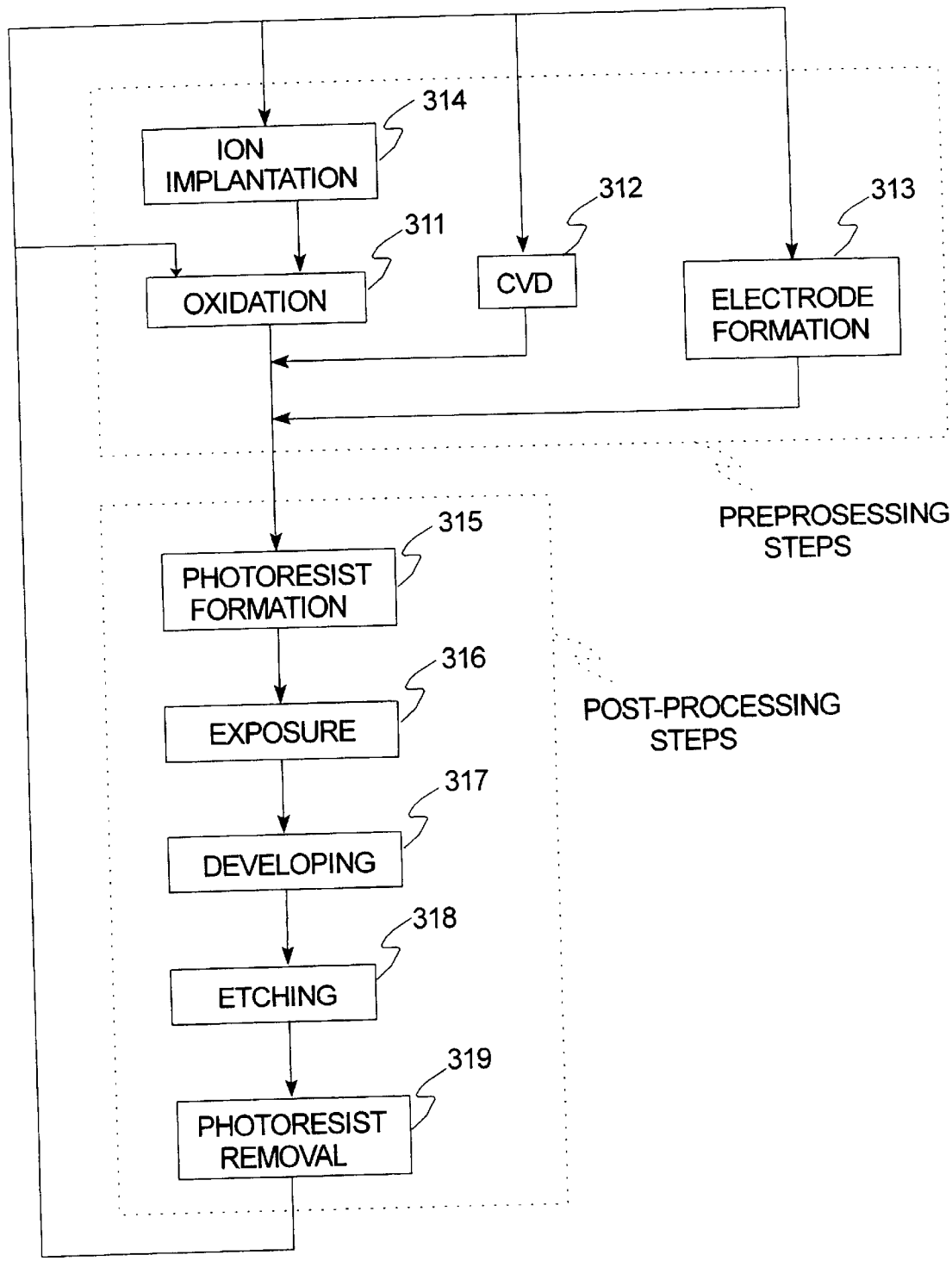
FIG. 10 is a flow chart that outlines device processing in more detail.

FIG. 10 illustrates a detailed flowchart example of the above-mentioned step 304 in the case of fabricating semiconductor devices. In FIG. 10, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular stage assembly 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly comprising:
   a first stage assembly movable along a first axis;
   a first mover connected to the first stage assembly, the first mover moving the first stage assembly at least along the first axis;
   a second stage assembly coupled to the first stage assembly;

a second mover that is connected to the second stage assembly and moves the second stage assembly relative to the first stage assembly along a second axis, the second axis differing from the first axis; and a reaction force canceling assembly connected to the second mover, the reaction force canceling assembly including an actuator and being movable relative to the second stage assembly along the second axis and reducing disturbance caused by the second mover.

2. The stage assembly of claim 1, wherein the reaction force canceling assembly includes a reaction stage that is coupled to the second mover, the reaction stage transferring reaction forces from the second mover away from the first stage assembly.

3. The stage assembly of claim 2, further comprising a mounting base, wherein the first stage assembly moves relative to the mounting base; and the reaction force canceling assembly includes a reaction force transferring assembly connected to the reaction stage, the reaction force transferring assembly being adapted to transfer reaction forces from the reaction stage to the mounting base.

4. The stage assembly of claim 1, wherein the actuator comprises a magnet array and a conductor array, and wherein the actuator transfers reaction forces from the second mover away from the first stage assembly.

5. The stage assembly of claim 4, wherein the magnet array extends longitudinally along the first axis.

6. The stage assembly of claim 4, further comprising a stage base, wherein the magnet array is connected to the stage base.

7. The stage assembly of claim 1, further comprising:
a third stage assembly coupled to the second stage assembly; and
a third mover connected to the third stage assembly, the third mover moving the third stage assembly relative to the second stage assembly along at least a third axis, about the first axis and about the second axis, the third axis differing from the first and second axes.

8. The stage assembly of claim 7, wherein third mover moves the third stage assembly relative to the second stage assembly along the first axis, along the second axis and about the third axis.

9. The stage assembly of claim 1, further comprising a fourth mover connected to the first stage assembly, the fourth mover moving the first stage assembly along the second axis.

10. The stage assembly of claim 1, further comprising a control system, wherein
the first mover includes a plurality of first stage movers adapted to move the first stage assembly along the first axis; and
the control system is connected to each of the first stage movers and controls each of the first stage movers according to the position of the second stage assembly relative to the first stage assembly.

11. The stage assembly of claim 10, further comprising a sensor connected to the control system, the sensor detecting the position of the second stage assembly relative to the first stage assembly along the second axis.

12. The stage assembly of claim 10, wherein
the first stage assembly and the second stage assembly have a combined center of gravity; and
the control system controls each first stage mover according to the position of combined center of gravity along the second axis.

13. The stage assembly of claim 10, wherein
the plurality of first stage movers includes a first, first stage mover and a second, first stage mover; and
the control system directs more current to the first, first stage mover than the second, first stage mover when the second stage assembly is closer to the first, first stage mover than the second, first stage mover.

14. The stage assembly of claim 13, wherein the control system directs more current to the second, first stage mover than the first, first stage mover when the second stage assembly is closer to the second, first stage mover than the first, first stage mover.

15. The stage assembly of claim 1 wherein the second stage assembly moves substantially concurrently with the first stage assembly along the first axis.

16. An exposure apparatus comprising: the stage assembly of claim 1 and an illumination device that directs a beam of light energy towards the stage assembly.

17. A device comprising a substrate on which an image has been formed by the exposure apparatus of claim 16.

18. A wafer on which an image has been formed by the exposure apparatus of claim 16.

19. A stage assembly comprising:
a first stage assembly movable along a first axis;
a first moving means for moving the first stage assembly at least along the first axis;
a second stage assembly coupled to the first stage assembly;
a second moving means for moving the second stage assembly relative to the first stage assembly along a second axis, the second axis differing from the first axis; and
a reaction force canceling means for reducing disturbance caused by the second moving means, the reaction force canceling means including actuating means and being movable relative to the second stage assembly along the second axis.

20. The stage assembly of claim 19, wherein the reaction force canceling means includes a reaction stage that is coupled to the second moving means, the reaction stage transferring reaction forces from the second moving means away from the first stage assembly.

21. The stage assembly of claim 20, further comprising a mounting base, wherein the first stage assembly moves relative to the mounting base; and the reaction force canceling means includes a reaction force transferring means connected to the reaction stage, the reaction force transferring means being adapted to transfer reaction forces from the reaction stage to the mounting base.

22. The stage assembly of claim 19, wherein the actuating means comprises a magnet array and a conductor array, and wherein the actuating means transfers reaction forces from the second mover away from the first stage assembly.

23. The stage assembly of claim 22, wherein the magnet array extends longitudinally along the first axis.

24. The stage assembly of claim 22, further comprising a stage base, wherein the magnet array is connected to the stage base.

25. The stage assembly of claim 19, further comprising:
a third stage assembly coupled to the second stage assembly; and
a third moving means for moving the third stage assembly relative to the second stage assembly along at least a third axis, about the first axis and about the second axis, the third axis differing from the first and second axes.

26. The stage assembly of claim 25, wherein the third moving means moves the third stage assembly relative to the second stage assembly along the first axis, along the second axis and about the third axis.

27. The stage assembly of claim 19, further comprising a fourth moving means for moving the first stage assembly along the second axis.

28. The stage assembly of claim 19, further comprising a control means, wherein
the first moving means includes a plurality of first stage movers adapted to move the first stage assembly along the first axis; and
the control means controls each of the first stage movers according to the position of the second stage assembly relative to the first stage assembly.

29. The stage assembly of claim 28, further comprising a detecting means for detecting the position of the second stage assembly relative to the first stage assembly along the second axis.

30. The stage assembly of claim 28, wherein
the first stage assembly and the second stage assembly have a combined center of gravity; and
the control means controls each first stage mover according to the position of combined center of gravity along the second axis.

31. The stage assembly of claim 30, wherein
the plurality of first stage movers includes a first, first stage mover and a second, first stage mover; and
the control means directs more current to the first, first stage mover than the second, first stage mover when the second stage assembly is closer to the first, first stage mover than the second, first stage mover.

32. The stage assembly of claim 31, wherein the control means directs more current to the second, first stage mover than the first, first stage mover when the second stage assembly is closer to the second, first stage mover than the first, first stage mover.

33. An exposure apparatus including the stage assembly of claim 19 and an irradiation means for directing a beam of energy towards the stage assembly.

34. A device comprising a substrate on which an image has been formed by the exposure apparatus of claim 33.

35. A wafer on which an image has been formed by the exposure apparatus of claim 33.

36. A stage assembly comprising:
a first stage assembly movable along a first axis;
a first mover connected to the first stage assembly, the first mover moving the first stage assembly at least along the first axis;
a second stage assembly that moves substantially concurrently with the first stage assembly along the first axis;
a second mover that is connected to the second stage assembly and moves the second stage assembly relative to the first stage assembly along a second axis, the second axis differing from the first axis; and
a reaction assembly including an actuator and being movable relative to the second stage assembly along the second axis and connected to the second mover, the reaction assembly inhibiting disturbances caused by the second mover from being transferred to the first stage assembly.

37. The stage assembly of claim 36, wherein the actuator comprises a magnet array and a conductor array, and wherein the actuator tranfers reaction forces from the second mover away from the first stage assembly.

38. The stage assembly of claim 37, wherein the magnet array extends longitudinally along the first axis.

39. The stage assembly of claim 37, further comprising a stage base, wherein the magnet array is connected to the stage base.

40. The stage assembly of claim 36, further comprising a mounting base, wherein the first stage assembly moves relative to the mounting base; and wherein the reaction assembly transfers disturbances from the second mover to the mounting base.

41. The stage assembly of claim 36, further comprising:
a third stage assembly coupled to the second stage assembly; and
a third mover connected to the third stage assembly, the third mover moving the third stage assembly relative to the second stage assembly along at least a third axis, about the first axis and about the second axis, the third axis differing from the first and second axes.

42. The stage assembly of claim 41, wherein the third mover moves the third stage assembly relative to the second stage assembly along the first axis, along the second axis and about the third axis.

43. The stage assembly of claim 36, further comprising a fourth mover connected to the first stage assembly, the fourth mover moving the first stage assembly along the second axis.

44. The stage assembly of claim 36, further comprising a control system wherein
the first mover includes a plurality of first stage movers adapted to move the first stage assembly along the first axis; and
the control system is connected to each of the first stage movers and controls each of the first stage movers according to the position of the second stage assembly relative to the first stage assembly.

45. The stage assembly of claim 44, wherein
the first stage assembly and the second stage assembly have a combined center of gravity; and
the control system controls each first stage mover according to the position of combined center of gravity along the second axis.

46. The stage assembly of claim 45, wherein
the plurality of first stage movers includes a first, first stage mover and a second, first stage mover; and
the control system directs more current to the first, first stage mover than the second, first stage mover when the second stage assembly is closer to the first, first stage mover than the second, first stage mover.

47. The stage assembly of claim 46, wherein the control system directs more current to the second, first stage mover than the first, first stage mover when the second stage assembly is closer to the second, first stage mover than the first, first stage mover.

48. An exposure apparatus comprising: the stage assembly of claim 36 and an illumination device that directs a beam of light energy towards the stage assembly.

49. A device comprising a substrate on which an image has been formed by the exposure apparatus of claim 48.

50. A wafer on which an image has been formed by the exposure apparatus of claim 48.

51. A method for making a stage assembly, the method comprising the steps of:
providing a first stage assembly that is movable along a first axis;
connecting a first mover to the first stage assembly, the first mover moving the first stage assembly at least along the first axis;

coupling a second stage assembly to the first stage assembly;

connecting a second mover to the second stage assembly, the second mover moving the second stage assembly relative to the first stage assembly along a second axis, the second axis differing from the first axis; and connecting a reaction force canceling assembly to the second mover, the reaction force canceling assembly including an actuator and being movable relative to second stage assembly along the second axis and reducing disturbances caused by the second mover.

52. The method of claim 51, wherein the acuator comprises a magnet array and a conductor array, and wherein the actuator transfers reaction forces from the second mover away from the first stage assembly.

53. The method of claim 52, wherein the magnet array extends longitudinally along the first axis.

54. The method of claim 52, further comprising a stage base, wherein the magnet array is connected to the stage base.

55. The method of claim 51, wherein the step of connecting a reaction force canceling assembly includes the step of coupling a reaction stage of the reaction force canceling assembly to the second mover, the reaction stage transferring reaction forces from the second mover away from the first stage assembly.

56. The method of claim 55 further comprising the step of providing a mounting base, wherein the first stage assembly moves relative to the mounting base; and the reaction force canceling assembly includes a reaction force transferring assembly connected to the reaction stage, the reaction force transferring assembly being adapted to transfer reaction forces from the reaction stage to the mounting base.

57. The method of claim 51, further comprising the steps of:

coupling a third stage assembly to the second stage assembly; and connecting a third mover to the third stage assembly, the third mover moving the third stage assembly relative to the second stage assembly along at least a third axis, about the first axis and about the second axis, the third axis differing from the first and second axes.

58. The method of claim 57, wherein the step of connecting the third stage assembly includes moving the third stage assembly relative to the second stage assembly along the first axis, along the second axis and about the third axis.

59. The method of claim 51, further comprising the step of connecting a fourth mover to the first stage assembly, the fourth mover moving the first stage assembly along the second axis.

60. The method of claim 51, wherein the first mover includes a plurality of first stage movers adapted to move the first stage assembly along the first axis; and further comprising the step of:

connecting a controller to each of the first stage movers, the controller controlling each of the first stage movers according to the position of the second stage assembly relative to the first stage assembly.

61. The method of claim 60, further comprising the step of connecting a sensor to the control system, the sensor detecting the position of the second stage assembly relative to the first stage assembly along the second axis.

62. The method of claim 60, wherein the first stage assembly and the second stage assembly have a combined center of gravity; and wherein the control system controls each first stage mover according to the position of combined center of gravity along the second axis.

63. The method of claim 60, wherein the plurality of first stage movers includes a first, first stage mover and a second, first stage mover; and the control system directs more current to the first, first stage mover than the second, first stage mover when the second stage assembly is closer to the first, first stage mover than the second, first stage mover.

64. The method of claim 63 wherein the control system directs more current to the second, first stage mover than the first, first stage mover when the second stage assembly is closer to the second, first stage mover than the first, first stage mover.

65. A method for making an exposure apparatus that forms an image on a substrate, the method comprising the steps of:

providing an irradiation apparatus that irradiates the substrate with radiation to form the image on the substrate; and providing the stage assembly made by the method of claim 51.

66. A method of making a wafer, the method including the steps of providing a substrate, and forming an image on the substrate utilizing the exposure apparatus made by the method of claim 65.

67. A method for making a device including at least the photolithography process, wherein the photolithography process utilizes the exposure apparatus made by the method of claim 65.

68. A method for making a stage assembly, the method comprising the steps of:

providing a first stage assembly that is movable along a first axis;

connecting a first moving means to the first stage assembly, the first moving means moving the first stage assembly at least along the first axis;

coupling a second stage assembly to the first stage assembly;

connecting a second moving means to the second stage assembly, the second moving means moving the second stage assembly relative to the first stage assembly along a second axis, the second axis differing from the first axis; and connecting a reaction force canceling means to the second moving means, the reaction force canceling means including actuating means and being movable relative to a second stage assembly along the second axis and reducing disturbance caused by the second moving means.

69. The method of claim 68, wherein the actuating means comprises a magnet array and a conductor array, and wherein the actuating means transfers reaction forces from the second mover away from the first stage assembly.

70. The method of claim 69, wherein the magnet array extends longitundinally along the first axis.

71. The method of claim 69, further comprising a stage base, wherein the magnet array is connected to the stage base.

72. The method of claim 68, wherein the step of connecting a reaction force canceling means includes the step of coupling a reaction stage of the reaction force canceling means to the second moving means, the reaction stage transferring reaction forces from the second moving means away from the first stage assembly.

73. The method of claim 72 further comprising the step of providing a mounting base, wherein the first stage assembly moves relative to the mounting base; and the reaction force canceling means includes a reaction force transferring assembly connected to the reaction stage, the reaction force transferring assembly being adapted to transfer reaction forces from the reaction stage to the mounting base.

74. The method of claim 68, further comprising the steps of:

coupling a third stage assembly to the second stage assembly; and connecting a third moving means to the third stage assembly, the third moving means moving the third stage assembly relative to the second stage assembly along at least a third axis, about the first axis and about the second axis, the third axis differing from the first and second axis.

75. The method of claim 68, further comprising the steps of connecting a fourth moving means to the first stage assembly, the fourth moving means moving the first stage assembly along the second axis.

76. The method of claim 68, wherein the first mover includes a plurality of first stage movers adapted to move the first stage assembly along the first axis; and further comprising the step of:

connecting a controller to each of the first stage movers, the controller controlling each of the first stage movers according to the position of the second stage assembly relative to the first stage assembly.

77. A method for making an exposure apparatus that forms an image on a substrate, the method comprising the steps of:

providing an irradiation means that irradiates the substrate with radiation to form the image on the substrate; and providing the stage assembly made by the method of claim 68.

78. A method of making a wafer, the method including the steps of providing a substrate and forming an image on the substrate utilizing the exposure apparatus made by the method of claim 77.

79. A method for making a device including at least the photolithography process, wherein the photolithography process utilizes the exposure apparatus made by the method of claim 77.

* * * * *